United States Patent
Hayashi et al.

(10) Patent No.: US 12,247,300 B2
(45) Date of Patent: Mar. 11, 2025

(54) CLEANING SOLUTION AND CLEANING METHOD

(71) Applicant: FUJIFILM Corporation, Tokyo (JP)

(72) Inventors: Kohei Hayashi, Shizuoka (JP); Tetsuya Kamimura, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 108 days.

(21) Appl. No.: 17/748,536

(22) Filed: May 19, 2022

(65) Prior Publication Data

US 2022/0275519 A1    Sep. 1, 2022

Related U.S. Application Data

(63) Continuation of application No. PCT/JP2020/038427, filed on Oct. 12, 2020.

(30) Foreign Application Priority Data

Nov. 22, 2019  (JP) ................................ 2019-211197
Jul. 9, 2020    (JP) ................................ 2020-118353

(51) Int. Cl.

| | | |
|---|---|---|
| C11D 1/75 | (2006.01) | |
| C11D 1/18 | (2006.01) | |
| C11D 3/04 | (2006.01) | |
| C11D 3/26 | (2006.01) | |
| C11D 3/28 | (2006.01) | |
| C11D 3/30 | (2006.01) | |
| C11D 3/33 | (2006.01) | |
| C11D 3/36 | (2006.01) | |
| C23G 1/14 | (2006.01) | |

(52) U.S. Cl.
CPC ............. *C23G 1/14* (2013.01); *C11D 1/18* (2013.01); *C11D 1/75* (2013.01); *C11D 3/042* (2013.01); *C11D 3/28* (2013.01); *C11D 3/30* (2013.01); *C11D 3/33* (2013.01); *C11D 3/361* (2013.01)

(58) Field of Classification Search
CPC .... C11D 1/75; C11D 3/28; C11D 3/30; C11D 3/33; C11D 3/361
USPC ............. 510/175, 176, 467, 499, 500, 503
See application file for complete search history.

(56) References Cited

U.S. PATENT DOCUMENTS

| | | | | |
|---|---|---|---|---|
| 8,853,081 B2 * | 10/2014 | Duong | ............ | H01L 21/31133 |
| | | | | 438/692 |
| 2005/0181961 A1 | 8/2005 | Misra et al. | | |
| 2008/0096141 A1 * | 4/2008 | Sawada | ............ | G03F 7/40 |
| | | | | 430/328 |
| 2012/0157368 A1 | 6/2012 | Mizuta et al. | | |
| 2019/0177669 A1 * | 6/2019 | Kamimura | ............ | H01L 21/304 |

FOREIGN PATENT DOCUMENTS

| | | | | |
|---|---|---|---|---|
| JP | 2005-026621 A | 1/2005 | | |
| JP | 2007-525836 A | 9/2007 | | |
| WO | WO-2006062005 A1 * | 6/2006 | ............ | G03F 7/40 |
| WO | 2006/129538 A1 | 12/2006 | | |
| WO | WO-2007047365 A2 * | 4/2007 | ............ | C09D 9/04 |
| WO | WO-2010104816 A1 * | 9/2010 | ......... | C11D 11/0047 |
| WO | 2011/027772 A1 | 3/2011 | | |
| WO | WO-2013122172 A1 * | 8/2013 | ............ | B08B 3/04 |
| WO | WO-2014091363 A1 * | 6/2014 | ............ | C11D 1/835 |
| WO | 2017/126554 A1 | 7/2017 | | |
| WO | 2018/043440 A1 | 3/2018 | | |

OTHER PUBLICATIONS

Office Action dated Apr. 25, 2023 from the Japanese Patent Office in JP Application No. 2021-558214.
Taiwanese Office Action issued Dec. 19, 2023 in Application No. 109138763.
International Search Report dated Dec. 22, 2020 in Application No. PCT/JP2020/038427.
Written Opinion of the International Searching Authority dated Dec. 22, 2020 in Application No. PCT/JP2020/038427.
International Preliminary Report on Patentability dated May 17, 2022 with a Translation of the Written Opinion of the International Searching Authority in Application No. PCT/JP2020/038427.

* cited by examiner

*Primary Examiner* — Gregory R Del Cotto
(74) *Attorney, Agent, or Firm* — Sughrue Mion, PLLC

(57) ABSTRACT

An object of the invention is to provide a cleaning liquid for semiconductor substrates having undergone a chemical mechanical polishing process, the cleaning liquid being excellent in corrosion prevention properties and defect suppression performance with respect to a metal film. Another object of the invention is to provide a method of cleaning semiconductor substrates having undergone a chemical mechanical polishing process. A cleaning liquid of the invention is used for semiconductor substrates having undergone a chemical mechanical polishing process and includes: an amine oxide compound that is a compound having an amine oxide group, or its salt; and at least one hydroxylamine compound selected from the group consisting of a hydroxylamine, a hydroxylamine derivative, and their salts, and the amine oxide compound content is 0.00001 to 0.15 mass % based on the total mass of the cleaning liquid.

20 Claims, No Drawings

CLEANING SOLUTION AND CLEANING METHOD

CROSS-REFERENCE TO RELATED APPLICATIONS

This application is a Continuation of PCT International Application No. PCT/JP2020/038427 filed on Oct. 12, 2020, which claims priority under 35 U.S.C. § 119(a) to Japanese Patent Application No. 2019-211197 filed on Nov. 22, 2019 and Japanese Patent Application No. 2020-118353 filed on Jul. 9, 2020. Each of the above applications is hereby expressly incorporated by reference, in its entirety, into the present application.

BACKGROUND OF THE INVENTION

The present invention relates to a cleaning liquid for semiconductor substrates and a method of cleaning semiconductor substrates.

Semiconductor devices such as charge-coupled devices (CCDs) and memories are manufactured by forming fine electronic circuit patterns on substrates using the photolithography technology. Specifically, a semiconductor device is manufactured by forming a resist film on a laminate including a metal film which is a wiring material, an etching stop layer and an interlayer dielectric layer on a substrate and carrying out a photolithography step and a dry etching step (e.g., plasma etching).

In some cases, a dry etching residue (for instance, metal components such as titanium-based metal derived from a metallic hard mask, or organic components derived from a photoresist film) remains on a substrate having undergone the dry etching step.

In manufacture of semiconductor devices, a chemical mechanical polishing (CMP) process is sometimes carried out to planarize a surface of a substrate having a metal wiring film, a barrier metal, an insulating film and the like by use of an abrasive slurry containing fine abrasive particles (e.g., silica, alumina). In the CMP process, metal components derived from the fine abrasive particles used in the CMP process and from the metal wiring film, the barrier metal and the like having been polished tend to remain on the surface of the semiconductor substrate after polishing.

Since those residues may cause a short-circuit between wires and affect electrical properties of a semiconductor, a cleaning step for removing the residues from the surface of the semiconductor substrate is usually carried out.

For instance, JP 2007-525836 A describes a composition for cleaning a semiconductor work-piece containing a specific cleaning agent, a specific chelating agent and a specific corrosion-inhibiting compound.

SUMMARY OF THE INVENTION

The present inventors studied a cleaning liquid for semiconductor substrates having undergone CMP by reference to, for example, JP 2007-525836 A and as a result found that when the cleaning liquid contains a hydroxylamine compound, defects readily occur at metal films (particularly, metal films containing cobalt, copper or tungsten) that serve as a wiring material, a plug material, and the like, while corrosion prevention properties with respect to such metal films are excellent. In other words, the present inventors found that cleaning liquids have room for further improvement in defect suppression performance with respect to a metal film (particularly, a metal film containing cobalt, copper or tungsten) borne by a semiconductor substrate having undergone CMP.

An object of the present invention is to provide a cleaning liquid for semiconductor substrates having undergone CMP, the cleaning liquid being excellent in corrosion prevention properties and defect suppression performance with respect to a metal film. Another object of the present invention is to provide a method of cleaning semiconductor substrates having undergone CMP.

The present inventors found that the above objects can be attained with the following configuration.

[1] A cleaning liquid for semiconductor substrates having undergone a chemical mechanical polishing process, the cleaning liquid comprising: an amine oxide compound that is a compound having an amine oxide group, or its salt; and at least one hydroxylamine compound selected from the group consisting of a hydroxylamine, a hydroxylamine derivative, and their salts, wherein a content of the amine oxide compound is 0.00001 to 0.15 mass % based on a total mass of the cleaning liquid.

[2] The cleaning liquid according to [1], wherein a mass ratio of the content of the amine oxide compound to a content of the at least one hydroxylamine compound is not less than 0.001.

[3] The cleaning liquid according to [1] or [2], wherein the amine oxide compound is a compound represented by Formula (1) described below.

[4] The cleaning liquid according to any one of [1] to [3], wherein the amine oxide compound includes N-ethylideneethylamine-N-oxide or trimethylamine-N-oxide.

[5] The cleaning liquid according to any one of [1] to [4], wherein the content of the amine oxide compound is 0.00001 to 0.05 mass % based on the total mass of the cleaning liquid.

[6] The cleaning liquid according to any one of [1] to [5], wherein the hydroxylamine compound is a compound represented by Formula (3) described below or its salt:

[7] The cleaning liquid according to any one of [1] to [6], wherein the hydroxylamine compound includes diethylhydroxylamine.

[8] The cleaning liquid according to any one of [1] to [7], wherein the cleaning liquid further contains a chelating agent.

[9] The cleaning liquid according to [8], wherein the chelating agent includes an aminopolycarboxylic acid-based chelating agent or a phosphonic acid-based chelating agent.

[10] The cleaning liquid according to any one of [1] to [9], wherein the cleaning liquid further contains a reducing agent.

[11] The cleaning liquid according to any one of [1] to [10], wherein the cleaning liquid further contains two or more reducing agents.

[12] The cleaning liquid according to any one of [1] to [11], wherein the cleaning liquid further contains a surfactant.

[13] The cleaning liquid according to any one of [1] to [12], wherein the cleaning liquid further contains two or more surfactants.

[14] The cleaning liquid according to any one of [1] to [13], wherein the cleaning liquid further contains at least one amine compound selected from the group consisting of a primary amine having a primary amino group in a molecule, a secondary amine having a secondary amino group in a molecule, a tertiary amine having a tertiary amino group in a molecule, a quaternary ammonium compound having a quaternary ammonium cation, and their salts.

[15] The cleaning liquid according to any one of [1] to [14], wherein the cleaning liquid further contains a quaternary ammonium compound having a quaternary ammonium cation, or its salt.

[16] The cleaning liquid according to [14] or [15], wherein the quaternary ammonium compound has an asymmetric structure.

[17] The cleaning liquid according to any one of [1] to [16], wherein the cleaning liquid further contains at least one selected from the group consisting of a primary amine having a primary amino group in a molecule, a secondary amine having a secondary amino group in a molecule, a tertiary amine having a tertiary amino group in a molecule, and their salts.

[18] The cleaning liquid according to any one of [1] to [17], wherein the cleaning liquid further contains water, and a content of the water is not less than 99.6 mass % based on the total mass of the cleaning liquid.

[19] The cleaning liquid according to any one of [1] to [18], wherein the cleaning liquid has a pH of 8.0 to 12.0 at 25° C.

[20] A method of cleaning semiconductor substrates, the method comprising a step of cleaning a semiconductor substrate having undergone a chemical mechanical polishing process by applying the cleaning liquid according to any one of [1] to [19] to the semiconductor substrate.

[21] The method according to [20], wherein the semiconductor substrate has a metal film containing at least one metal selected from copper, cobalt, and tungsten.

The present invention makes it possible to provide a cleaning liquid for semiconductor substrates having undergone CMP, the cleaning liquid being excellent in corrosion prevention properties and defect suppression performance with respect to a metal film. The present invention also makes it possible to provide a method of cleaning semiconductor substrates having undergone CMP.

DETAILED DESCRIPTION OF THE INVENTION

One exemplary embodiment of the invention is described below.

In this specification, a numerical range expressed in the form of "A to B" should read as a range including both the values A and B as the range's lower and upper limits, respectively.

In this specification, when a certain component comprising two or more types is present, the "content" of the certain component means the total content of the two or more types.

In this specification, the term "content" of a certain component refers to the content of the component contained in a cleaning liquid when the cleaning liquid is applied to a semiconductor substrate to clean the semiconductor substrate, and the expression "total mass of the cleaning liquid" refers to the total mass of that cleaning liquid, unless otherwise noted.

In this specification, "ppm" means "parts per million ($10^{-6}$)," and "ppb" means "parts per billion ($10^{-9}$)."

In compounds described in this specification, isomers (compounds with the same number of atoms but different structures), optical isomers, and isotopes may be included unless particularly limited. As isomers and isotopes, only one type or plural types may be included.

In this specification, "psi" refers to "pound-force per square inch," and 1 psi=6894.76 Pa.

The cleaning liquid of the present invention (hereinafter also simply called "cleaning liquid") is a cleaning liquid for semiconductor substrates having undergone a chemical mechanical polishing (CMP) process, the cleaning liquid comprising: an amine oxide compound that is a compound having an amine oxide group, or its salt (hereinafter also simply called "amine oxide compound"); and at least one hydroxylamine compound selected from the group consisting of a hydroxylamine, a hydroxylamine derivative, and their salts (hereinafter also simply called "hydroxylamine compound"). The content of the amine oxide compound is 0.00001 to 0.15 mass % based on the total mass of the cleaning liquid.

The present inventors found that when a cleaning liquid containing an amine oxide compound in a specific amount as well as a hydroxylamine compound is used, corrosion prevention properties and defect suppression performance with respect to a metal film (particularly, a metal film containing Co, Cu or W) in a step of cleaning a semiconductor substrate having undergone CMP (hereinafter also called "effects of the invention") are excellent.

Although it is unclear why the effects of the invention are obtained when a cleaning liquid contains a hydroxylamine compound and a specific amount of amine oxide compound, the present inventors assume that particles including inorganic matter, such as silica, adhering to a surface of a semiconductor substrate having undergone CMP interact with the amine oxide compound, whereby those particles including inorganic matter are removed from the surface of the semiconductor substrate.

[Cleaning Liquid]

The cleaning liquid contains an amine oxide compound and a hydroxylamine compound.

Each component contained in the cleaning liquid is described below.

[Amine Oxide Compound]

The amine oxide compound is a compound having an amine oxide group ($N^+$—$O^-$, also called "amine-N-oxide group"), or its salt.

The salt of the amine oxide compound may be an inorganic or organic acid salt; preferred is a salt thereof with an inorganic acid in which at least one non-metal selected from the group consisting of Cl, S, N and P is bonded to hydrogen, and more preferred is a hydrochloride, a sulfate, or a nitrate.

Examples of the amine oxide compound include a nitrone compound and a tertiary amine-N-oxide, which will be described below.

<Nitrone Compound>

The nitrone compound refers to a compound having a nitrone group ($>C=N^+(-O^-)$—R (where R represents a substituent)), or its salt. The nitrone compound can also be said to be an N-oxide of an imine.

In the nitrone compound, examples of the substituent that a nitrogen atom of the nitrone group has include a hydroxy group, an alkyl group, an alkenyl group, an alkynyl group, an acyl group, an alkyloxy group, an amidyl group, a carboxyl group, an alkyl sulfonyl group, a sulfonic acid group, and an aryl group. The carboxyl group and the sulfonic acid group may form salts with a cation.

For the nitrone compound, a compound represented by Formula (1) below is preferred.

[Chemical Formula 1]

(1)

In Formula (1), $R^1$ and $R^2$ each independently represent a hydrogen atom or an organic group, and $R^3$ represents an organic group. $R^1$ or $R^2$ may be bonded with $R^3$ to form a non-aromatic ring that may have a substituent.

Examples of the organic group represented by $R^1$, $R^2$ and $R^3$ include an alkyl group, an alkenyl group, an alkynyl group, and an aryl group, with an alkyl group being preferred, and an alkyl group having 1 to 10 carbon atoms being more preferred. The alkyl group and the alkyl group having 1 to 10 carbon atoms may be any of linear, branched and cyclic groups.

$R^1$ and $R^2$ in Formula (1) is preferably a hydrogen atom or an alkyl group, more preferably a hydrogen atom or an alkyl group having 1 to 10 carbon atoms, and even more preferably a hydrogen atom or an alkyl group having 1 to 6 carbon atoms.

In particular, preferably, one of $R^1$ and $R^2$ represents a hydrogen atom; more preferably, one of $R^1$ and $R^2$ represents a hydrogen atom, while the other thereof represents a methyl group, an ethyl group, an n-propyl group, or an isopropyl group; and even more preferably, one of $R^1$ and $R^2$ represents a hydrogen atom, while the other thereof represents a methyl group or an ethyl group.

For $R^3$ in Formula (1), an alkyl group is preferred, an alkyl group having 1 to 6 carbon atoms is more preferred, a methyl group, an ethyl group, an n-propyl group, or an isopropyl group is even more preferred, and an ethyl group is particularly preferred.

The non-aromatic ring that may be formed by bonding of $R^1$ or $R^2$ with $R^3$ is not particularly limited as long as it is a heterocyclic ring having no aromatic properties and having at least one nitrogen atom, and examples thereof include a nitrogen-containing non-aromatic ring whose number of atoms is five or six and having a double bond between a nitrogen atom and a carbon atom, as exemplified by a pyrroline ring and a tetrahydropyridine ring.

Examples of the substituent that the non-aromatic ring formed by bonding of $R^1$ or $R^2$ with $R^3$ may have include an alkyl group having 1 to 4 carbon atoms.

Examples of the nitrone compound include N-ethylidenemethylamine-N-oxide, N-ethylideneethylamine-N-oxide, N-ethylidenepropylamine-N-oxide, N-ethylidenebutylamine-N-oxide, N-ethylideneethanolamine-N-oxide, N-ethylideneethoxyethanolamine-N-oxide, N-propylidenemethylamine-N-oxide, N-propylideneethylamine-N-oxide, N-propylidenepropylamine-N-oxide, N-propylidenebutylamine-N-oxide, N-propylideneethanolamine-N-oxide, N-butylidenemethylamine-N-oxide, N-butylideneethylamine-N-oxide, N-butylidenebutylamine-N-oxide, N-butylideneethanolamine-N-oxide, N-benzylidene-t-butylamine-N-oxide, 1-pyrroline-N-oxide, and 2,3,4,5-tetrahydropyrrolidine-N-oxide.

Of these, preferred is N-ethylidenemethylamine-N-oxide, N-ethylideneethylamine-N-oxide, N-propylidenemethylamine-N-oxide, or N-propylideneethylamine-N-oxide, and more preferred is N-ethylideneethylamine-N-oxide.

The nitrone compounds may be used singly or in combination of two or more. As the nitrone compound, a commercial product or a composite suitably synthesized by a known method may be used.

One exemplary method of synthesizing the nitrone compound is the following method of Yamaura et al. (Masanori YAMAURA et al., the 83rd spring annual meeting of the Chemical Society of Japan, 1PA-019, 2003). A manganese dioxide is added to a methanol solution of dialkylhydroxylamine having a structure corresponding to the target nitrone compound, and the mixture at room temperature is stirred under air to react. The mixture is allowed to react for one day while the degree of progress of the reaction is observed, is subsequently filtered to remove a manganese dioxide, and is then purified using a celite column. Thereafter, a solvent is removed with an evaporator. Thus, the target nitrone compound is synthesized. The nitrone compound may also be synthesized by the method described in S. Murahashi et al., J. Org. Chem. 55, 1736 (1990).

<Tertiary Amine-N-Oxide>

The tertiary amine-N-oxide refers to a compound that is an N-oxide of a tertiary amine having a tertiary amino group ($>$N—) in the molecule, or its salt.

In the tertiary amine-N-oxide, examples of substituents that a nitrogen atom has include a hydroxy group, an alkyl group, an alkenyl group, an alkynyl group, an acyl group, an alkyloxy group, an amidyl group, a carboxyl group, an alkyl sulfonyl group, a sulfonic acid group, and an aryl group. The carboxyl group and the sulfonic acid group may be salts of a cation.

For the tertiary amine-N-oxide, a compound represented by Formula (2) below is preferred.

[Chemical Formula 2]

(2)

In Formula (2), $R^3$, $R^4$ and $R^5$ each independently represent an organic group. Two of $R^3$, $R^4$ and $R^5$ may be bonded together to form a non-aromatic ring that may have a substituent.

Examples of the organic group represented by $R^3$, $R^4$ and $R^5$ include an alkyl group, an alkenyl group, an alkynyl group, and an aryl group, with an alkyl group being preferred, and an alkyl group having 1 to 6 carbon atoms being more preferred. The alkyl group and the alkyl group having 1 to 6 carbon atoms may be any of linear, branched and cyclic groups.

For $R^3$, $R^4$ and $R^5$, a methyl group, an ethyl group, an n-propyl group, or an isopropyl group is even more preferred, and a methyl group or an ethyl group is particularly preferred.

For the combination of $R^3$, $R^4$ and $R^5$, preferred is the combination of $R^3$, $R^4$ and $R^5$ each of which is a methyl group or an ethyl group, and more preferred is the combination of $R^3$, $R^4$ and $R^5$ each of which is a methyl group.

The non-aromatic ring formed by bonding of two of $R^3$, $R^4$ and $R^5$ that may have a substituent is not particularly limited as long as it is a heterocyclic ring having no aromatic properties and having at least one nitrogen atom, and examples thereof include a nitrogen-containing non-aromatic ring whose number of atoms is five or six, as exemplified by a pyrrolidine ring, a piperidine ring, a piperazine ring, and a morpholine ring.

Examples of the substituent that the non-aromatic ring formed by bonding of two of $R^3$, $R^4$ and $R^5$ may have include an alkyl group having 1 to 4 carbon atoms.

Examples of the tertiary amine-N-oxide include trimethylamine-N-oxide, dimethylethylamine-N-oxide, methyldiethylamine-N-oxide, triethyl-N-amine oxide, isopropyldimethylamine oxide, dimethyl(2-hydroxyethyl)amine oxide, dimethylbutylamine oxide, and 4-methylmorpholine-N-oxide.

Of these, preferred is trimethylamine-N-oxide, dimethylethylamine-N-oxide, methyldiethylamine-N-oxide, triethyl-N-amine oxide, or 4-methylmorpholine-N-oxide, and more preferred is trimethylamine-N-oxide or 4-methylmorpholine-N-oxide.

The tertiary amine-N-oxides may be used singly or in combination of two or more. As the tertiary amine-N-oxide, a commercial product or a composite suitably synthesized by a known method may be used.

The cleaning liquid may contain, as the amine oxide compound, a compound other than the foregoing nitrone compound and tertiary amine-N-oxide.

Examples of other amine oxide compounds than the nitrone compound and the tertiary amine-N-oxide include 1-pyrroline-N-oxide, 3,4-dihydroisoquinoline-N-oxide, and N-benzylidenebenzilamine-N-oxide.

For the amine oxide compound, preferred is a compound selected from the group consisting of a nitrone compound represented by Formula (1) above in which $R^1$ and $R^2$ each independently represent a hydrogen atom or an alkyl group having 1 to 6 carbon atoms and $R^3$ represents an alkyl group having 1 to 6 carbon atoms, and a tertiary amine-N-oxide represented by Formula (2) above in which $R^3$, $R^4$ and $R^5$ represent an alkyl group having 1 to 6 carbon atoms.

In particular, more preferred is N-ethylidenemethylamine-N-oxide, N-ethylideneethylamine-N-oxide, N-propylidenemethylamine-N-oxide, N-propylideneethylamine-N-oxide, trimethylamine-N-oxide, dimethylethylamine-N-oxide, methyldiethylamine-N-oxide, or triethyl-N-amine oxide, and even more preferred is N-ethylideneethylamine-N-oxide or trimethylamine-N-oxide.

The cleaning liquid may contain one amine oxide compound alone or two or more amine oxide compounds.

The amine oxide compound content is 0.00001 to 0.15 mass % based on the total mass of the cleaning liquid. The amine oxide compound content within the foregoing range leads to the cleaning liquid having excellent corrosion prevention properties and defect suppression performance.

The amine oxide compound content is preferably not more than 0.1 mass % and more preferably not more than 0.05 mass % based on the total mass of the cleaning liquid because this leads to more excellent corrosion prevention properties (particularly with respect to a Cu-containing metal film).

Further, the amine oxide compound content is preferably not less than 0.001 mass % and more preferably not less than 0.05 mass % based on the total mass of components, excluding a solvent, in the cleaning liquid. The upper limit thereof is preferably not more than 90 mass %, more preferably not more than 75 mass % and even more preferably not more than 65 mass % based on the total mass of components, excluding a solvent, in the cleaning liquid. The expression "the total mass of components, excluding a solvent, in the cleaning liquid" refers to the sum of the contents of all components contained in the cleaning liquid, excluding water and an organic solvent.

The mass ratio of the amine oxide compound content to the hydroxylamine compound content (amine oxide compound content/hydroxylamine compound content) is preferably not less than 0.0002, more preferably not less than 0.001, even more preferably not less than 0.01 and particularly preferably not less than 0.04. At the same time, the mass ratio of the amine oxide compound content to the hydroxylamine compound content (amine oxide compound content/hydroxylamine compound content) is preferably not more than 15.0, more preferably not more than 7.0, even more preferably not more than 5.5, and particularly preferably not more than 3.35 because this leads to more excellent corrosion prevention performance (particularly with respect to a Cu-containing metal film).

[Hydroxylamine Compound]

The cleaning liquid contains the hydroxylamine compound.

The hydroxylamine compound refers to at least one selected from the group consisting of a hydroxylamine ($NH_2OH$), a hydroxylamine derivative, and their salts.

The hydroxylamine derivative refers to a compound of hydroxylamine ($NH_2OH$) obtained through substitution with at least one organic group.

A salt of the hydroxylamine or the hydroxylamine derivative may be an inorganic or organic acid salt of the hydroxylamine or the hydroxylamine derivative. For the salt of the hydroxylamine or the hydroxylamine derivative, preferred is a salt thereof with an inorganic acid in which at least one non-metal selected from the group consisting of Cl, S, N and P is bonded to hydrogen, and more preferred is a hydrochloride, a sulfate, or a nitrate.

Examples of the hydroxylamine compound include a compound represented by Formula (3) below or its salt.

[Chemical Formula 3]

(3)

In Formula (3), $R^6$ and $R^7$ each independently represent a hydrogen atom or an organic group. $R^6$ and $R^7$ may be bonded together to form a non-aromatic ring that may have a substituent.

For the organic group represented by $R^6$ and $R^7$, an alkyl group having 1 to 6 carbon atoms is preferred. The alkyl group having 1 to 6 carbon atoms may be any of linear, branched and cyclic groups.

At least one of $R^6$ and $R^7$ is preferably an organic group (more preferably, an alkyl group having 1 to 6 carbon atoms).

For the alkyl group having 1 to 6 carbon atoms, an ethyl group or an n-propyl group is preferred, and an ethyl group is more preferred.

The non-aromatic ring formed by bonding of $R^6$ and $R^7$ that may have a substituent is not particularly limited as long as it is a heterocyclic ring having no aromatic properties and having at least one nitrogen atom, and examples thereof include a nitrogen-containing non-aromatic ring whose number of atoms is five or six, as exemplified by a pyrrolidine ring, a piperidine ring, a piperazine ring, and a morpholine ring. Of these, a pyrrolidine ring is preferred.

Examples of the substituent that the non-aromatic ring formed by bonding of $R^6$ and $R^7$ may have include an alkyl group having 1 to 4 carbon atoms, an oxo group, and a thioxo group.

Examples of the hydroxylamine compound include hydroxylamine, O-methylhydroxylamine, O-ethylhydroxylamine, N-methylhydroxylamine, N,N-dimethylhydroxylamine, N,O-dimethylhydroxylamine, N-ethylhydroxylamine, N,N-diethylhydroxylamine (DEHA), N,O-diethylhydroxylamine, O,N,N-trimethylhydroxylamine, N,N-dicarboxyethylhydroxylamine, N,N-disulfoethylhydroxylamine, N-hydroxysuccinimide (NHSI), and 2-hydroxy-2-azaadamantane.

Of these, N-ethylhydroxylamine, DEHA, N-n-propylhydroxylamine, or NHSI is preferred, and DEHA is more preferred.

The hydroxylamine compounds may be used singly or in combination of two or more. As the hydroxylamine compound, a commercial product or a composite suitably synthesized by a known method may be used.

The hydroxylamine compound content of the cleaning liquid is preferably not less than 0.001 mass %, more preferably not less than 0.005 mass % and, in terms of providing more excellent corrosion prevention performance (particularly with respect to a Co-containing metal film), even more preferably not less than 0.02 mass % based on the total mass of the cleaning liquid. The upper limit thereof is not particularly limited and is preferably not more than 0.2 mass % and more preferably not more than 0.15 mass %.

Further, the hydroxylamine compound content is preferably not less than 0.5 mass %, more preferably not less than 2 mass % and even more preferably not less than 15 mass % based on the total mass of components, excluding a solvent, in the cleaning liquid. The upper limit thereof is preferably not more than 98 mass % and more preferably not more than 96 mass % based on the total mass of components, excluding a solvent, in the cleaning liquid.

[Water]

The cleaning liquid preferably contains water as a solvent.

The type of water used in the cleaning liquid is not particularly limited as long as it has no bad influence on a semiconductor substrate, and distilled water, deionized water and pure water (ultrapure water) are usable. Pure water is preferred because it hardly contains impurities and its influence on a semiconductor substrate is smaller in a semiconductor substrate manufacturing process.

The water content of the cleaning liquid may be the balance other than the amine oxide compound, the hydroxylamine compound, and optional components to be described later. The water content is preferably not less than 99 mass %, more preferably not less than 99.3 mass %, even more preferably not less than 99.6 mass %, and particularly preferably not less than 99.85 mass % based on the total mass of the cleaning liquid. The upper limit thereof is not particularly limited and is preferably not more than 99.99 mass % and more preferably not more than 99.95 mass % based on the total mass of the cleaning liquid.

[Optional Component]

The cleaning liquid may contain other optional components in addition to the foregoing components. Optional components are described below.

<Chelating Agent>

The cleaning liquid may contain a chelating agent.

The chelating agent used in the cleaning liquid is a compound that has a function of chelating with metal contained in a residue in a cleaning step of a semiconductor substrate. In particular, a compound having in the molecule two or more functional groups (coordination groups) that form coordinate bonds with metal ions.

Examples of the coordination group that the chelating agent has include an acid group and a cationic group. Examples of the acid group include a carboxy group, a phosphonic acid group, a sulfo group, and a phenolic hydroxy group. One example of the cationic group is an amino group.

The chelating agent used in the cleaning liquid preferably has the acid group as the coordination group and more preferably has at least one coordination group selected from a carboxy group and a phosphonic acid group because this leads to more excellent corrosion prevention performance (particularly with respect to a Co-containing metal film) and more excellent residue removal performance (particularly on Co-containing metal residues).

Examples of the chelating agent include an organic chelating agent and an inorganic chelating agent.

The organic chelating agent is a chelating agent constituted of an organic compound, and examples thereof include a carboxylic acid-based chelating agent having a carboxy group as the coordination group, a phosphonic acid-based chelating agent having a phosphonic acid group as the coordination group, and a polyamine-based chelating agent having only an amino group as the coordination group.

Examples of the inorganic chelating agent include condensed phosphoric acid and salts thereof.

For the chelating agent, the organic chelating agent is preferred, and an organic chelating agent having at least one coordination group selected from a carboxy group, a phosphonic acid group and an amino group is more preferred.

The chelating agent is preferably of low molecular weight. Specifically, the molecular weight of the chelating agent is preferably not more than 600, more preferably not more than 450 and even more preferably not more than 300.

When the chelating agent is the organic chelating agent, the number of carbon atoms is preferably not more than 15, more preferably not more than 12 and even more preferably not more than 8.

(Carboxylic Acid-based Chelating Agent)

The carboxylic acid-based chelating agent is a chelating agent having a carboxy group as the coordination group in the molecule, and examples thereof include an aminopolycarboxylic acid-based chelating agent, an amino acid-based chelating agent, a hydroxy carboxylic acid-based chelating agent, and an aliphatic carboxylic acid-based chelating agent.

Examples of the aminopolycarboxylic acid-based chelating agent include butylene diamine tetraacetic acid, diethylenetriamine pentaacetic acid (DTPA), ethylenediamine tetrapropionic acid, triethylenetetramine hexacetic acid, 1,3-diamino-2-hydroxypropane-N,N,N',N'-tetraacetic acid, propylenediamine tetraacetic acid, ethylenediamine tetraacetic acid (EDTA), trans-1,2-diaminocyclohexane tetraacetic acid, ethylenediamine diacetic acid, ethylenediamine dipropionic acid, 1,6-hexamethylene-diamine-N,N,N',N'-tetraacetic acid, N,N-bis(2-hydroxybenzyl)ethylenediamine-N,N-diacetic acid, diaminopropane tetraacetic acid, 1,4,7,10-tetraazacyclododecane-tetraacetic acid, diaminopropanol tetraacetic acid, (hydroxyethyl)ethylenediamine triacetic acid, and iminodiacetic acid (IDA).

Of these, diethylenetriamine pentaacetic acid (DTPA), ethylenediamine tetraacetic acid (EDTA), trans-1,2-diaminocyclohexane tetraacetic acid, or iminodiacetic acid (IDA) is preferable.

Examples of the amino acid-based chelating agent include glycine, serine, α-alanine (2-aminopropionic acid), β-alanine (3-aminopropionic acid), lysine, leucine, isoleucine, cystine, cysteine, ethionine, threonine, tryptophan, tyrosine, valine, histidine, histidine derivatives, asparagine, aspartic acid, glutamine, glutamic acid, arginine, proline, methionine, phenylalanine, the compounds described in paragraphs [0021] to [0023] of JP 2016-086094 A, and salts thereof. For the histidine derivatives, the compounds described in JP 2015-165561 A and JP 2015-165562 A can be applied, and the contents thereof are incorporated in the present specification. Examples of the salts include alkali metal salts such as a sodium salt and a potassium salt, ammonium salts, carbonates, and acetates.

Examples of the hydroxy carboxylic acid-based chelating agent include malic acid, citric acid, glycolic acid, gluconic acid, heptonic acid, tartaric acid, and lactic acid, with citric acid or tartaric acid being preferred.

Examples of the aliphatic carboxylic acid-based chelating agent include oxalic acid, malonic acid, succinic acid, glutaric acid, adipic acid, pimelic acid, sebacic acid, and maleic acid.

For the carboxylic acid-based chelating agent, the aminopolycarboxylic acid-based chelating agent, the amino acid-based chelating agent, or the hydroxy carboxylic acid-based chelating agent is preferred, and in terms of providing more excellent corrosion prevention performance (particularly with respect to a W-containing metal film) and more excellent residue removal performance (particularly on W-containing metal residues), the aminopolycarboxylic acid-based chelating agent or the amino acid-based chelating agent is more preferred.

(Phosphonic Acid-Based Chelating Agent)

The phosphonic acid-based chelating agent is a chelating agent having at least one phosphonic acid group in the molecule. Examples of the phosphonic acid-based chelating agent include compounds represented by Formulae (P1), (P2) and (P3) below.

[Chemical Formula 4]

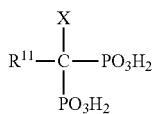

(P1)

In the formula, X represents a hydrogen atom or a hydroxy group, and $R^{11}$ represents a hydrogen atom or an alkyl group having 1 to 10 carbon atoms.

The alkyl group having 1 to 10 carbon atoms represented by $R^{11}$ in Formula (P1) may be any of linear, branched and cyclic groups.

For $R^{11}$ in Formula (P1), an alkyl group having 1 to 6 carbon atoms is preferred, and a methyl group, an ethyl group, an n-propyl group, or an isopropyl group is more preferred.

It should be noted that n-represents a normal-type in specific examples of an alkyl group described in the present specification.

For X in Formula (P1), a hydroxy group is preferred.

For the phosphonic acid-based chelating agent represented by Formula (P1), preferred is ethylidenediphosphonic acid, 1-hydroxyethylidene-1,1'-diphosphonic acid (HEDPO), 1-hydroxypropylidene-1,1'-diphosphonic acid, or 1-hydroxybutylidene-1,1'-diphosphonic acid.

[Chemical Formula 5]

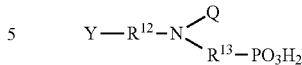

(P2)

In the formula, Q represents a hydrogen atom or $R^{13}$—$PO_3H_2$, $R^{12}$ and $R^{13}$ each independently represent an alkylene group, and Y represents a hydrogen atom, —$R^{13}$—$PO_3H_2$, or a group represented by Formula (P4) below.

[Chemical Formula 6]

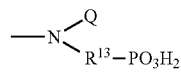

(P4)

In the formula, Q and $R^{13}$ are the same as those in Formula (P2).

Examples of the alkylene group represented by $R^{12}$ in Formula (P2) include a linear or branched alkylene group having 1 to 12 carbon atoms.

For the alkylene group represented by $R^{12}$, a linear or branched alkylene group having 1 to 6 carbon atoms is preferred, a linear or branched alkylene group having 1 to 4 carbon atoms is more preferred, and an ethylene group is even more preferred.

For the alkylene group represented by $R^{13}$ in Formulae (P2) and (P4), examples thereof include a linear or branched alkylene group having 1 to 10 carbon atoms, with a linear or branched alkylene group having 1 to 4 carbon atoms being preferred, a methylene group or an ethylene group being more preferred, and a methylene group being even more preferred.

For Q in Formulae (P2) and (P4), —$R^{13}$—$PO_3H_2$ is preferred.

For Y in Formula (P2), —$R^{13}$—$PO_3H_2$ or a group represented by Formula (P4) is preferred, and a group represented by Formula (P4) is more preferred.

For the phosphonic acid-based chelating agent represented by Formula (P2), preferred is ethylaminobis(methylenephosphonic acid), dodecylaminobis(methylenephosphonic acid), nitrilotris(methylenephosphonic acid) (NTPO), ethylenediamine bis(methylenephosphonic acid) (EDDPO), 1,3-propylenediamine bis(methylenephosphonic acid), ethylenediamine tetra(methylenephosphonic acid) (EDTPO), ethylenediamine tetra(ethylenephosphonic acid), 1,3-propylenediamine tetra(methylenephosphonic acid) (PDTMP), 1,2-diaminopropane tetra(methylenephosphonic acid), or 1,6-hexamethylenediamine tetra(methylenephosphonic acid).

[Chemical Formula 7]

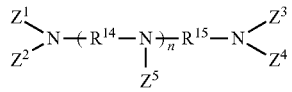

(P3)

In the formula, $R^{14}$ and $R^{15}$ each independently represent an alkylene group having 1 to 4 carbon atoms, n represents an integer of 1 to 4, and at least four of $Z^1$ to $Z^4$ and n moieties of $Z^5$s represent a phosphonic acid group-containing alkyl group while the remainder represents an alkyl group.

The alkylene group having 1 to 4 carbon atoms represented by $R^{14}$ and $R^{15}$ in Formula (P3) may be a linear or branched group. Examples of the alkylene group having 1 to 4 carbon atoms represented by $R^{14}$ and $R^{15}$ include a methylene group, an ethylene group, a propylene group, a trimethylene group, an ethylmethylene group, a tetramethylene group, a 2-methylpropylene group, a 2-methyltrimethylene group, and an ethylethylene group, with an ethylene group being preferred.

For n in Formula (P3), 1 or 2 is preferred.

Examples of an alkyl group in the alkyl group and the phosphonic acid group-containing alkyl group represented by $Z^1$ to $Z^5$ in Formula (P3) include a linear or branched alkyl group having 1 to 4 carbon atoms, with a methyl group being preferred.

The number of phosphonic acid groups in the phosphonic acid group-containing alkyl group represented by $Z^1$ to $Z^5$ is preferably one or two and more preferably one.

Examples of the phosphonic acid group-containing alkyl group represented by $Z^1$ to $Z^5$ include a linear or branched alkyl group having 1 to 4 carbon atoms and one or two phosphonic acid groups, with a (mono)phosphonomethyl group or a (mono)phosphonoethyl group being preferred, and a (mono)phosphonomethyl group being more preferred.

For $Z^1$ to $Z^5$ in Formula (P3), it is preferable that each of $Z^1$ to $Z^4$ and n moieties of $Z^5$s be the foregoing phosphonic acid group-containing alkyl group.

For the phosphonic acid-based chelating agent represented by Formula (P3), preferred is diethylenetriamine penta(methylenephosphonic acid) (DEPPO), diethylenetriamine penta(ethylenephosphonic acid), triethylenetetramine hexa(methylenephosphonic acid), or triethylenetetramine hexa(ethylenephosphonic acid).

For the phosphonic acid-based chelating agent used in the cleaning liquid, not only the phosphonic acid-based chelating agents represented by Formulae (P1), (P2) and (P3) above but also the compounds described in paragraphs [0026] to [0036] of the description of WO 2018/020878 and the compounds ((co)polymers) described in paragraphs [0031] to [0046] of the description of WO 2018/030006 can be applied, and the contents thereof are incorporated in the present specification.

For the phosphonic acid-based chelating agent used in the cleaning liquid, those compounds listed as preferable specific examples of the phosphonic acid-based chelating agents represented by Formulae (P1), (P2) and (P3) above are preferred, HEDPO, NTPO, EDTPO, or DEPPO is more preferred, and HEDPO is even more preferred.

The phosphonic acid-based chelating agents may be used singly or in combination of two or more.

A commercial phosphonic acid-based chelating agent may contain water such as distilled water, deionized water and ultrapure water in addition to a phosphonic acid-based chelating agent, and it is no problem to use such a phosphonic acid-based chelating agent containing water.

(Polyamine-Based Chelating Agent)

The polyamine-based chelating agent is a chelating agent having only an amino group as the coordination group in the molecule. Examples of the polyamine-based chelating agent include an aminopolycarboxylic acid-based chelating agent, an amino acid-based chelating agent, a hydroxy carboxylic acid-based chelating agent, and an aliphatic carboxylic acid-based chelating agent.

Examples of the polyamine-based chelating agent include alkylene diamines such as ethylenediamine (EDA), 1,3-propanediamine (PDA), 1,2-propanediamine, 1,3-butanediamine, and 1,4-butanediamine, and polyalkyl polyamines such as diethylenetriamine (DETA), triethylenetetramine (TETA), bis(aminopropyl)ethylenediamine (BAPEDA), and tetraethylenepentamine.

Examples of the condensed phosphoric acid and salts thereof which are the inorganic chelating agents include pyrophosphoric acid and salts thereof, metaphosphoric acid and salts thereof, tripolyphosphoric acid and salts thereof, and hexametaphosphoric acid and salts thereof.

For the chelating agent, the aminopolycarboxylic acid-based chelating agent or the phosphonic acid-based chelating agent is preferred because this leads to more excellent corrosion prevention performance with respect to a Co-containing metal film and more excellent removal performance on Co-containing metal residues.

The chelating agents may be used singly or in combination of two or more.

The chelating agent content of the cleaning liquid is not particularly limited and is, based on the total mass of the cleaning liquid, preferably not more than 0.25 mass % and more preferably not more than 0.1 mass %, with less than 0.02 mass % being even more preferred because this leads to more excellent corrosion prevention performance with respect to a Cu-containing metal film and more excellent removal performance on Co-containing metal residues, and not more than 0.008 mass % being particularly preferred because this leads to more excellent corrosion prevention performance with respect to a Co-containing metal film.

The lower limit of the chelating agent content is not particularly limited and is preferably not less than 0.00001 mass %, more preferably not less than 0.0001 mass % and even more preferably not less than 0.0005 mass % based on the total mass of the cleaning liquid.

Further, when the cleaning liquid contains the chelating agent, the chelating agent content is preferably not less than 0.02 mass % and more preferably not less than 0.1 mass % based on the total mass of components, excluding a solvent, in the cleaning liquid. The upper limit thereof is preferably not more than 70 mass % based on the total mass of components, excluding a solvent, in the cleaning liquid.

<Reducing Agent>

The cleaning liquid may contain a reducing agent.

The reducing agent is a compound having an oxidative effect and having the function of oxidizing $OH^-$ ions or dissolved oxygen contained in the cleaning liquid, and is also called an oxygen scavenger. Note that the hydroxylamine compound above is not included in the reducing agent.

The cleaning liquid preferably contains the reducing agent because this leads to excellent corrosion prevention performance (particularly with respect to a Co-containing metal film).

The reducing agent used in the cleaning liquid is not particularly limited, and examples thereof include an ascorbic acid compound, a catechol compound, a hydrazide compound, and a reducing sulfur compound.

(Ascorbic Acid Compound)

The cleaning liquid may contain an ascorbic acid compound as the reducing agent.

The ascorbic acid compound refers to at least one selected from the group consisting of ascorbic acid, an ascorbic acid derivative, and their salts.

Examples of the ascorbic acid derivative include an ascorbic acid phosphoric acid ester and an ascorbic acid sulfuric acid ester.

For the ascorbic acid compound, preferred is the ascorbic acid, the ascorbic acid phosphoric acid ester, or the ascorbic acid sulfuric acid ester, and more preferred is the ascorbic acid.

(Catechol Compound)

The cleaning liquid may contain a catechol compound as the reducing agent.

The catechol compound refers to at least one selected from the group consisting of pyrocatechol(benzene-1,2-diol) and a catechol derivative.

The catechol derivative refers to a compound of pyrocatechol obtained through substitution with at least one substituent. Examples of the substituent that the catechol derivative has include a hydroxy group, a carboxy group, a carboxylic acid ester group, a sulfo group, a sulfonic acid ester group, an alkyl group (preferably with 1 to 6 carbon atoms and more preferably with 1 to 4 carbon atoms), and an aryl group (preferably a phenyl group). The carboxy group and the sulfo group that the catechol derivative has as substituents may be salts of a cation. The alkyl group and the aryl group that the catechol derivative has as substituents may further have a substituent.

Examples of the catechol compound include pyrocatechol, 4-tert-butylcatechol, pyrogallol, gallic acid, methyl gallate, 1,2,4-benzenetriol, and tiron, with pyrogallol being preferred.

(Hydrazide Compound)

The cleaning liquid may contain a hydrazide compound as the reducing agent.

The hydrazide compound refers to a compound obtained by substituting a hydroxy group of an acid with a hydrazino group (—NH—NH$_2$), as well as its derivative (a compound with a hydrazino group having at least one substituent).

The hydrazide compound may have two or more hydrazino groups.

Examples of the hydrazide compound include carboxylic acid hydrazide and sulfonic acid hydrazide. In particular, carbohydrazide (CHZ) is preferred.

It is preferable to use DEHA as the hydroxylamine compound in combination with the hydrazide compound because this leads to more excellent corrosion prevention performance with respect to a Co-containing metal film.

When the cleaning liquid contains the hydrazide compound, the hydrazide compound content is not particularly limited and is preferably 0.001 to 0.2 mass %, more preferably 0.005 to 0.15 mass % and even more preferably 0.02 to 0.15 mass % based on the total mass of the cleaning liquid.

Further, when the cleaning liquid contains the hydrazide compound, the hydrazide compound content is preferably 10 to 80 mass % and more preferably 20 to 60 mass % based on the total mass of components, excluding a solvent, in the cleaning liquid.

Further, when the cleaning liquid contains the hydrazide compound, the mass ratio between the hydroxylamine compound (more preferably, DEHA) content and the hydrazide compound content is preferably 1:5 to 5:1, more preferably 1:3 to 3:1, even more preferably 1:2 to 2:1, and particularly preferably 4:5 to 5:4.

The cleaning liquid preferably contains the hydrazide compound and also another reducing agent different from the hydrazide compound because this leads to more excellent corrosion prevention performance with respect to a Co-containing metal film.

(Reducing Sulfur Compound)

The cleaning liquid may contain a reducing sulfur compound as the reducing agent.

The reducing sulfur compound is not particularly limited as long as it contains a sulfur atom and functions as the reducing agent, and examples thereof include mercaptosuccinic acid, dithiodiglycerol, bis(2,3-dihydroxypropylthio) ethylene, sodium 3-(2,3-dihydroxypropylthio)-2-methyl-propylsulfonate, 1-thioglycerol, sodium 3-mercapto-1-propanesulfonate, 2-mercaptoethanol, thioglycolic acid, and 3-mercapto-1-propanol.

Of these, a compound having an SH group (mercapto compound) is preferred, and 1-thioglycerol, sodium 3-mercapto-1-propanesulfonate, 2-mercaptoethanol, 3-mercapto-1-propanol, or thioglycolic acid is more preferred.

The reducing agents may be used singly or in combination of two or more. The cleaning liquid preferably contains two or more reducing agents because this leads to more excellent corrosion prevention performance (particularly with respect to a Co-containing metal film).

When the cleaning liquid contains the reducing agent, the reducing agent content is not particularly limited and is preferably 0.00001 to 0.2 mass % and more preferably 0.0001 to 0.15 mass % based on the total mass of the cleaning liquid.

Further, when the cleaning liquid contains the reducing agent, the reducing agent content is preferably 0.01 to 80 mass % and more preferably 0.05 to 60 mass % based on the total mass of components, excluding a solvent, in the cleaning liquid.

Those reducing agents for use may be commercial products or composites synthesized by a known method.

<Amine Compound>

The cleaning liquid may contain an amine compound that is at least one selected from the group consisting of a primary amine having a primary amino group (—NH$_2$) in the molecule, a secondary amine having a secondary amino group (>NH) in the molecule, a tertiary amine having a tertiary amino group (>N—) in the molecule, a quaternary ammonium compound having a quaternary ammonium cation, and their salts.

In the present specification, those compounds included in the amine oxide compound, the hydroxylamine compound, the chelating agent, or the reducing agent described above are not included in the amine compound.

(Primary Amine, Secondary Amine and Tertiary Amine)

The cleaning liquid may contain at least one selected from the group consisting of the primary amine, the secondary amine, and the tertiary amine (hereinafter also called "primary to tertiary amines").

The cleaning liquid preferably contains the primary to tertiary amines because this leads to more excellent defect suppression performance (particularly with respect to a Cu- or Co-containing metal film).

Examples of the primary to tertiary amines include an amino alcohol, an amine having a cyclic structure, and a monoamine other than those.

Examples of salts of the primary to tertiary amines include a salt of an inorganic acid in which at least one non-metal selected from the group consisting of Cl, S, N and P is bonded to hydrogen, and preferred is a hydrochloride, a sulfate, or a nitrate.

—Amino Alcohol—

The amino alcohol is, of the primary to tertiary amines, a compound further having at least one hydroxylalkyl group in the molecule. The amino alcohol may have any of primary to tertiary amino groups and preferably has a primary amino group.

Examples of the amino alcohol include monoethanolamine (MEA), 2-amino-2-methyl-1-propanol (AMP), diethanolamine (DEA), triethanolamine (TEA), diethylene glycol amine (DEGA), tris(hydroxymethyl)aminomethane (Tris), 2-(methylamino)-2-methyl-1-propanol (N-MAMP), dimethylbis(2-hydroxyethyl)ammonium hydroxide (AH212), and 2-(2-aminoethylamino)ethanol.

Of these, AMP, N-MAMP, MEA, DEA, Tris or DEGA is preferred, and AMP or MEA is more preferred.

—Amine Having Cyclic Structure—

Of the amine having a cyclic structure, the cyclic structure is not particularly limited, and examples thereof include a heterocyclic ring in which at least one of atoms constituting the ring is a nitrogen atom (nitrogen-containing heterocyclic ring).

Examples of the amine having a cyclic structure include an azole compound, a pyridine compound, a pyrazine compound, a pyrimidine compound, a piperazine compound, and a cyclic amidine compound.

The azole compound is a compound having a five-membered heterocyclic ring containing at least one nitrogen atom and having aromatic properties. The number of nitrogen atoms included in the five-membered heterocyclic ring of the azole compound is not particularly limited, and is preferably 2 to 4 and more preferably 3 or 4.

Examples of the azole compound include an imidazole compound, a pyrazole compound, a thiazole compound, a triazole compound, and a tetrazole compound, with a triazole compound or a tetrazole compound being preferred, and 1,2,4-triazole, 5-aminotetrazole, or 1H-tetrazole being more preferred.

The pyridine compound is a compound having a six-membered heterocyclic ring (pyridine ring) containing one nitrogen atom and having aromatic properties.

Specific examples of the pyridine compound include pyridine, 3-aminopyridine, 4-aminopyridine, 3-hydroxypyridine, 4-hydroxypyridine, 2-acetamidopyridine, 2-cyanopyridine, 2-carboxypyridine, and 4-carboxypyridine.

The pyrazine compound is a compound having a six-membered heterocyclic ring (pyrazine ring) containing two nitrogen atoms at the para positions and having aromatic properties, and the pyrimidine compound is a compound having a six-membered heterocyclic ring (pyrimidine ring) containing two nitrogen atoms at the meta positions and having aromatic properties.

Examples of the pyrazine compound include pyrazine, 2-methylpyrazine, 2,5-dimethylpyrazine, 2,3,5-trimethylpyrazine, 2,3,5,6-tetramethylpyrazine, 2-ethyl-3-methylpyrazine, and 2-amino-5-methylpyrazine.

Examples of the pyrimidine compound include pyrimidine, 2-methylpyrimidine, 2-aminopyrimidine, and 4,6-dimethylpyrimidine.

The piperazine compound is a compound having a six-membered heterocyclic ring (piperazine ring) in which opposed —CH— groups in a cyclohexane ring are substituted with nitrogen atoms. The piperazine compound is preferable because this leads to more excellent defect suppression performance (particularly with respect to a Cu or Co-containing metal film).

The piperazine compound may have a substituent on the piperazine ring. Examples of the substituent include a hydroxy group, an alkyl group having 1 to 4 carbon atoms that may have a hydroxy group, and an aryl group having 6 to 10 carbon atoms.

Examples of the piperazine compound include piperazine, 1-methylpiperazine, 1-ethylpiperazine, 1-propylpiperazine, 1-butylpiperazine, 2-methylpiperazine, 1,4-dimethylpiperazine, 2,5-dimethylpiperazine, 2,6-dimethylpiperazine, 1-phenylpiperazine, 2-hydroxypiperazine, 2-hydroxymethylpiperazine, 1-(2-hydroxyethyl)piperazine (HEP), N-(2-aminoethyl)piperazine (AEP), 1,4-bis(2-hydroxyethyl)piperazine (BHEP), 1,4-bis(2-aminoethyl)piperazine (BAEP), and 1,4-bis(3-aminopropyl)piperazine (BAPP), with preferred being piperazine, 1-methylpiperazine, 2-methylpiperazine, HEP, AEP, BHEP, BAEP, or BAPP, and more preferred being piperazine.

The cyclic amidine compound is a compound having a heterocyclic ring including an amidine structure (>N—C=N—) in the ring.

The number of atoms constituting the heterocyclic ring of the cyclic amidine compound is not particularly limited and is preferably five or six and more preferably six.

Examples of the cyclic amidine compound include diazabicycloundecene (1,8-diazabicyclo[5.4.0]undec-7-ene: DBU), diazabicyclononene (1,5-diazabicyclo[4.3.0]non-5-ene: DBN), 3,4,6,7,8,9,10,11-octahydro-2H-pyrimido[1.2-a]azocine, 3,4,6,7,8,9-hexahydro-2H-pyrido[1.2-a]pyrimidine, 2,5,6,7-terahydro-3H-pyrrolo[1.2-a]imidazole, 3-ethyl-2,3,4,6,7,8,9,10-octahydropyrimido[1.2-a]azepine, and creatinine.

Examples of the amine having a cyclic structure include, in addition to the foregoing examples, a compound having a five-membered heterocyclic ring with no aromatic properties such as 1,3-dimethyl-2-imidazolidinone or imidazolidinethione, and a compound having a seven-membered ring containing a nitrogen atom(s).

For the amine having a cyclic structure, preferred is the triazole compound, the tetrazole compound, the piperazine compound, or the cyclic amidine compound, and more preferred is the piperazine compound.

—Monoamine—

The monoamine other than the amino alcohol and the amine having a cyclic structure is not particularly limited, and examples thereof include a compound represented by Formula (a) below (hereinafter also referred to as "compound (a)"):

$$NH_xR_{(3-x)} \quad (a)$$

where R represents an alkyl group having 1 to 3 carbon atoms, and x represents an integer of 0 to 2.

Examples of the alkyl group having 1 to 3 carbon atoms include a methyl group, an ethyl group, an n-propyl group, and an isopropyl group, with an ethyl group or an n-propyl group being preferred.

Examples of the compound (a) include methylamine, ethylamine, propylamine, dimethylamine, diethylamine, trimethylamine, and triethylamine, with preferred being ethylamine, propylamine, diethylamine, or triethylamine.

Examples of the monoamine other than the compound (a) include benzylamine, n-butylamine, 3-methoxypropylamine, tert-butylamine, n-hexylamine, cyclohexylamine, n-octylamine, 2-ethylhexylamine, and 4-(2-aminoethyl)morpholine (AEM).

For the primary to tertiary amines, the compounds described in paragraphs [0034] to [0056] of the description of WO 2013/162020 can be applied, and the contents thereof are incorporated in the present specification.

For the primary to tertiary amines contained in the cleaning liquid, preferred is monoethanolamine (MEA), 2-amino-2-methyl-1-propanol (AMP), 2-(methylamino)-2-methyl-1-propanol (N-MAMP), diethanolamine (DEA), diethylene glycol amine (DEGA), tris(hydroxymethyl)aminomethane (Tris), piperazine, N-(2-aminoethyl)piperazine (AEP), 1,4-bis(2-hydroxyethyl)piperazine (BHEP), 1,4-bis(2-aminoethyl)piperazine (BAEP), or 1,4-bis(3-aminopropyl)piperazine (BAPP).

The primary to tertiary amines may be used singly or in combination of two or more. The cleaning liquid preferably contains two or more primary to tertiary amines because this leads to even more excellent defect suppression performance (particularly with respect to a Co-containing metal film).

When the cleaning liquid contains the primary to tertiary amines, the content thereof is preferably 0.0001 to 0.15 mass % and more preferably 0.0003 to 0.1 mass % based on the total mass of the cleaning liquid.

Further, when the cleaning liquid contains the primary to tertiary amines, the content of the primary to tertiary amines is preferably 0.03 to 30 mass % and more preferably 0.1 to 10 mass % based on the total mass of components, excluding a solvent, in the cleaning liquid.

(Quaternary Ammonium Compound)

The cleaning liquid may contain a quaternary ammonium compound.

The quaternary ammonium compound is not particularly limited as long as it is a quaternary ammonium cation-containing compound in which a nitrogen atom is attached to four hydrocarbon groups (preferably, alkyl groups) through substitution. Examples of the quaternary ammonium compound include quaternary ammonium hydroxide, quaternary ammonium fluoride, quaternary ammonium bromide, quaternary ammonium iodide, quaternary ammonium acetate, and quaternary ammonium carbonate.

For the quaternary ammonium compound, preferred is quaternary ammonium hydroxide represented by Formula (4):

$$(R^8)_4N^+OH^- \qquad (4)$$

where $R^8$ represents an alkyl group that may have a hydroxy group or a phenyl group as a substituent. Four $R^8$s may be the same or different.

For the alkyl group represented by $R^8$, an alkyl group having 1 to 4 carbon atoms is preferred, and a methyl group or an ethyl group is more preferred.

For the alkyl group that may have a hydroxy group or a phenyl group as represented by $R^8$, preferred is a methyl group, an ethyl group, a propyl group, a butyl group, a 2-hydroxyethyl group, or a benzyl group, more preferred is a methyl group, an ethyl group, a propyl group, a butyl group, or a 2-hydroxyethyl group, and even more preferred is a methyl group, an ethyl group, or a 2-hydroxyethyl group.

Examples of the quaternary ammonium compound include tetramethylammonium hydroxide (TMAH), trimethylethylammonium hydroxide (TMEAH), diethyldimethylammonium hydroxide (DEDMAH), triethylmethylammonium hydroxide (TEMAH), tetraethylammonium hydroxide (TEAH), tetrapropylammonium hydroxide (TPAH), tetrabutylammonium hydroxide (TBAH), 2-hydroxyethyl trimethylammonium hydroxide (choline), bis(2-hydroxyethyl) dimethylammonium hydroxide, tri(2-hydroxyethyl) methylammonium hydroxide, tetra(2-hydroxyethyl) ammonium hydroxide, benzyltrimethylammonium hydroxide (BTMAH), and cetyltrimethylammonium hydroxide.

As the quaternary ammonium compound other than the foregoing specific examples, for example, the compounds described in paragraph [0021] of JP 2018-107353 A can be applied, and the contents thereof are incorporated in the present specification.

For the quaternary ammonium compound used for the cleaning liquid, TMAH, TMEAH, DEDMAH, TEAH, TPAH, TBAH, choline, or bis(2-hydroxyethyl)dimethylammonium hydroxide is preferred, and choline is more preferred.

The quaternary ammonium compound preferably has an asymmetric structure because this leads to more excellent damage resistance. The quaternary ammonium compound "having an asymmetric structure" means that four hydrocarbon groups attached to a nitrogen atom through substitution are different from one another.

Examples of the quaternary ammonium compound having an asymmetric structure include TMEAH, DEDMAH, TEMAH, choline, and bis(2-hydroxyethyl)dimethylammonium hydroxide, with choline being preferred.

The quaternary ammonium compounds may be used singly or in combination of two or more.

When the cleaning liquid contains the quaternary ammonium compound, the content thereof is preferably 0.0001 to 0.15 mass % and more preferably 0.0003 to 0.1 mass % based on the total mass of the cleaning liquid.

Further, when the cleaning liquid contains the quaternary ammonium compound, the quaternary ammonium compound content is preferably 0.03 to 30 mass % and more preferably 0.1 to 10 mass % based on the total mass of components, excluding a solvent, in the cleaning liquid.

The amine compounds may be used singly or in combination of two or more.

When the cleaning liquid contains the amine compound, the content thereof is preferably 0.0001 to 0.15 mass % and more preferably 0.0003 to 0.1 mass % based on the total mass of the cleaning liquid.

Further, when the cleaning liquid contains the amine compound, the amine compound content is preferably 0.03 to 30 mass % and more preferably 0.1 to 10 mass % based on the total mass of components, excluding a solvent, in the cleaning liquid.

When the pH of the cleaning liquid is adjusted using the amine compound, the amine compound content may be suitably adjusted in accordance with the target pH.

<Surfactant>

The cleaning liquid may contain a surfactant.

The surfactant is not particularly limited as long as it is a compound having a hydrophilic group and a hydrophobic group (lipophilic group) in the molecule, and examples thereof include an anionic surfactant, a cationic surfactant, a nonionic surfactant, and an amphoteric surfactant.

The cleaning liquid preferably contains the surfactant because this leads to more excellent effects of the invention (particularly defect suppression performance and corrosion prevention performance with respect to a Co-containing metal film).

In many cases, the surfactant has a hydrophobic group selected from an aliphatic hydrocarbon group, an aromatic hydrocarbon group, and combinations thereof. The hydrophobic group that the surfactant has is not particularly limited; when the hydrophobic group contains an aromatic hydrocarbon group, the number of carbon atoms is preferably 6 or more and more preferably 10 or more. When the hydrophobic group contains no aromatic hydrocarbon group and is constituted only of an aliphatic hydrocarbon group, the number of carbon atoms is preferably 9 or more, more preferably 13 or more, and even more preferably 16 or more. The upper limit of the number of carbon atoms of the hydrophobic group is not particularly limited and is preferably not more than 20 and more preferably not more than 18.

(Anionic Surfactant)

Examples of the anionic surfactant that is usable in the cleaning liquid include a phosphoric acid ester-based surfactant having a phosphoric acid ester group, a phosphonic acid-based surfactant having a phosphonic acid group, a sulfonic acid-based surfactant having a sulfo group, a carboxylic acid-based surfactant having a carboxy group, and a sulfuric acid ester-based surfactant having a sulfuric acid ester group, with those groups each acting as a hydrophilic group (acid group).

—Phosphoric Acid Ester-Based Surfactant—

Examples of the phosphoric acid ester-based surfactant include phosphoric acid ester (alkyl ether phosphoric acid ester), polyoxyalkylene ether phosphoric acid ester, and salts thereof. While the phosphoric acid ester and the polyoxyalkylene ether phosphoric acid ester usually include both a monoester and a diester, a monoester or a diester may be used alone.

Examples of the salts of the phosphoric acid ester-based surfactant include a sodium salt, a potassium salt, an ammonium salt, and an organic amine salt.

A monovalent aliphatic hydrocarbon group that the phosphoric acid ester and the polyoxyalkylene ether phosphoric acid ester have is not particularly limited and is preferably an alkyl or alkenyl group having 2 to 24 carbon atoms, more preferably an alkyl or alkenyl group having 6 to 18 carbon atoms, and even more preferably an alkyl or alkenyl group having 12 to 18 carbon atoms.

A divalent alkylene group that the polyoxyalkylene ether phosphoric acid ester has is not particularly limited and is preferably an alkylene group having 2 to 6 carbon atoms and more preferably an ethylene group or a 1,2-propanediyl group. The number of repeats of an oxyalkylene group in the polyoxyalkylene ether phosphoric acid ester is preferably 1 to 12 and more preferably 3 to 10.

For the phosphoric acid ester-based surfactant, preferred is octyl phosphoric acid ester, lauryl phosphoric acid ester, tridecyl phosphoric acid ester, myristyl phosphoric acid ester, cetyl phosphoric acid ester, stearyl phosphoric acid ester, or polyoxyalkylene ether phosphoric acid ester in which the number of repeats of an oxyalkylene group is 3 to 10, and more preferred is polyoxyalkylene ether phosphoric acid ester in which the number of repeats of an oxyalkylene group is 3 to 10.

For the phosphoric acid ester-based surfactant, the compounds described in paragraphs [0012] to [0019] of JP 2011-040502 A can also be applied, and the contents thereof are incorporated in the present specification.

In addition, examples of commercial polyoxyalkylene ether phosphoric acid ester include "CRODAFOS O3A LQ" and "CRODAFOS O10A LQ" (both of which are commercial names) manufactured by Croda Japan KK.

—Phosphonic Acid-Based Surfactant—

Examples of the phosphonic acid-based surfactant include alkyl phosphonic acid and polyvinyl phosphonic acid as well as aminomethyl phosphonic acid described in JP 2012-057108 A.

—Sulfonic Acid-based Surfactant—

Examples of the sulfonic acid-based surfactant include alkyl sulfonic acid, alkylbenzene sulfonic acid, alkylnaphthalene sulfonic acid, alkyl diphenyl ether disulfonic acid, alkyl methyl taurine, sulfosuccinic acid diester, polyoxyalkylene alkyl ether sulfonic acid, and salts thereof.

A monovalent alkyl group that the sulfonic acid-based surfactant has is not particularly limited and is preferably an alkyl group having 2 to 24 carbon atoms and more preferably an alkyl group having 6 to 18 carbon atoms.

A divalent alkylene group that the polyoxyalkylene alkyl ether sulfonic acid has is not particularly limited and is preferably an ethylene group or a 1,2-propanediyl group. The number of repeats of an oxyalkylene group in the polyoxyalkylene alkyl ether sulfonic acid is preferably 1 to 12 and more preferably 1 to 6.

Specific examples of the sulfonic acid-based surfactant include hexanesulfonic acid, octanesulfonic acid, decanesulfonic acid, dodecanesulfonic acid, toluenesulfonic acid, cumenesulfonic acid, octylbenzenesulfonic acid, dodecylbenzenesulfonic acid (DBSA), dinitrobenzenesulfonic acid (DNBSA), and lauryl dodecylphenyl ether disulfonic acid (LDPEDSA).

—Carboxylic Acid-Based Surfactant—

Examples of the carboxylic acid-based surfactant include alkyl carboxylic acid, alkylbenzene carboxylic acid, and polyoxyalkylene alkyl ether carboxylic acid, and salts thereof.

A monovalent alkyl group that the carboxylic acid-based surfactant has is not particularly limited and is preferably an alkyl group having 7 to 25 carbon atoms and more preferably an alkyl group having 11 to 17 carbon atoms.

A divalent alkylene group that the polyoxyalkylene alkyl ether carboxylic acid has is not particularly limited and is preferably an ethylene group or a 1,2-propanediyl group. The number of repeats of an oxyalkylene group in the polyoxyalkylene alkyl ether carboxylic acid is preferably 1 to 12 and more preferably 1 to 6.

Specific examples of the carboxylic acid-based surfactant include lauric acid, myristic acid, palmitic acid, stearic acid, polyoxyethylene lauryl ether acetic acid, and polyoxyethylene tridecyl ether acetic acid.

—Sulfuric Acid Ester-Based Surfactant—

Examples of the sulfuric acid ester-based surfactant include sulfuric acid ester (alkyl ether sulfuric acid ester), polyoxyalkylene ether sulfuric acid ester, and salts thereof.

A monovalent alkyl group that the sulfuric acid ester and the polyoxyalkylene ether sulfuric acid ester have is not particularly limited and is preferably an alkyl group having 2 to 24 carbon atoms and more preferably an alkyl group having 6 to 18 carbon atoms.

A divalent alkylene group that the polyoxyalkylene ether sulfuric acid ester has is not particularly limited and is preferably an ethylene group or a 1,2-propanediyl group. The number of repeats of an oxyalkylene group in the polyoxyalkylene ether sulfuric acid ester is preferably 1 to 12 and more preferably 1 to 6.

Specific examples of the sulfuric acid ester-based surfactant include lauryl sulfuric acid ester, myristyl sulfuric acid ester, and polyoxyethylene lauryl ether sulfuric acid ester.

(Cationic Surfactant)

Examples of the cationic surfactant include primary to tertiary alkylamine salts (e.g., monostearyl ammonium chloride, distearyl ammonium chloride, and tristearyl ammonium chloride), and modified aliphatic polyamine (e.g., polyethylene polyamine).

(Nonionic Surfactant)

Examples of the nonionic surfactant include polyoxyalkylene alkyl ether (e.g., polyoxyethylene stearyl ether), polyoxyalkylene alkenyl ether (e.g., polyoxyethylene oleyl ether), polyoxyethylene alkyl phenyl ether (e.g., polyoxyethylene nonyl phenyl ether), polyoxyalkylene glycol (e.g., polyoxypropylene polyoxyethylene glycol), polyoxyalkylene monoalkylate (monoalkyl fatty acid ester polyoxyalkylene) (e.g., polyoxyethylene monoalkylates such as polyoxyethylene monostearate and polyoxyethylene monooleate), polyoxyalkylene dialkylate (dialkyl fatty acid ester polyoxyalkylene) (e.g., polyoxyethylene dialkylates such as polyoxyethylene distearate and polyoxyethylene dioleate), bispolyoxyalkylene alkylamide (e.g., bispolyoxyethylene stearylamide), sorbitan fatty acid ester, polyoxyethylene sorbitan fatty acid ester, polyoxyethylene alkylamine, glycerine fatty acid ester, oxyethylene-oxypropylene block copolymer, acetylene glycol-based surfactant, and acetylene-based polyoxyethylene oxide.
(Amphoteric Surfactant)

Examples of the amphoteric surfactant include carboxy betaine (e.g., alkyl-N,N-dimethylaminoacetic acid betaine and alkyl-N,N-dihydroxyethylaminoacetic acid betaine), sulfo betaine (e.g., alkyl-N,N-dimethylsulfoethylene ammonium betaine), and imidazolinium betaine (e.g., 2-alkyl-N-carboxymethyl-N-hydroxyethylimidazolinium betaine).

For the surfactant, the compounds described in paragraphs [0092] to [0096] of JP 2015-158662 A, paragraphs [0045] to [0046] of JP 2012-151273 A, and paragraphs [0014] to [0020] of JP 2009-147389 A can also be applied, and the contents thereof are incorporated in the present specification.

For the surfactant, at least one selected from the group consisting of the phosphoric acid ester-based surfactant, the sulfonic acid-based surfactant, the phosphonic acid-based surfactant, and the carboxylic acid-based surfactant is preferred, and the phosphoric acid ester-based surfactant is more preferred.

Those surfactants may be used singly or in combination of two or more. The cleaning liquid preferably contains two or more surfactants because this leads to more excellent defect suppression performance (particularly with respect to a Cu-containing metal film).

When the cleaning liquid contains the surfactant, the content thereof is preferably 0.00001 to 0.05 mass %, more preferably 0.00005 to 0.03 mass % and even more preferably 0.0001 to 0.01 mass % based on the total mass of the cleaning liquid.

Further, when the cleaning liquid contains the surfactant, the surfactant content is preferably 0.01 to 5 mass % and more preferably 0.02 to 2 mass % based on the total mass of components, excluding a solvent, in the cleaning liquid.

Commercial products may be used as those surfactants.
<Additives>

The cleaning liquid may optionally contain other additives than the foregoing components. Examples of such additives include a pH adjuster, an anticorrosive, a polymer, a fluorine compound, and an organic solvent.
(pH Adjuster)

The cleaning liquid may contain a pH adjuster for adjusting and maintaining the pH of the cleaning liquid. Examples of the pH adjuster include a basic compound and an acidic compound other than the foregoing components.

Examples of the basic compound include a basic organic compound and a basic inorganic compound.

The basic organic compound is a basic organic compound different from any of the hydroxylamine compound, the amine oxide compound, and the amine compound described above. Examples of the basic organic compound include nitro, nitroso, oxime, ketoxime, aldoxime, lactam, isocyanide compounds, and urea.

Examples of the basic inorganic compound include alkali metal hydroxide, alkaline earth metal hydroxide, and ammonia.

Examples of the alkali metal hydroxide include lithium hydroxide, sodium hydroxide, potassium hydroxide, and cesium hydroxide. Examples of the alkaline earth metal hydroxide include calcium hydroxide, strontium hydroxide, and barium hydroxide.

The hydroxylamine compound, the amine oxide compound, and/or the amine compound contained in the cleaning liquid may also serve as the basic compound for increasing the pH of the cleaning liquid.

Those basic compounds for use may be commercial products or composites suitably synthesized by a known method.

Examples of the acidic compound include an inorganic acid and an organic acid.

Examples of the inorganic acid include hydrochloric acid, sulfuric acid, sulfurous acid, nitric acid, nitrous acid, phosphoric acid, boric acid, and hexafluorophosphoric acid. Salts of the inorganic acids may also be used, and examples thereof include ammonium salts of the inorganic acids, more specifically, ammonium chloride, ammonium sulfate, ammonium sulfite, ammonium nitrate, ammonium nitrite, ammonium phosphate, ammonium borate, and ammonium hexafluorophosphate.

For the inorganic acid, phosphoric acid or phosphate is preferred, and phosphoric acid is more preferred.

The organic acid is an organic compound having an acidic functional group and showing acidic properties (pH: less than 7.0) in an aqueous solution and is a compound that is not included in the chelating agent or the anionic surfactant described above. Examples of the organic acid include lower aliphatic monocarboxylic acids (with 1 to 4 carbon atoms) such as formic acid, acetic acid, propionic acid and butyric acid.

As the acidic compound, a salt of the acidic compound may be used as long as it forms an acid or an acid ion (anion) in an aqueous solution.

The chelating agent and/or anionic surfactant contained in the cleaning liquid may also serve as the acidic compound for reducing the pH of the cleaning liquid.

As the acidic compound, a commercial product or a composite suitably synthesized by a known method may be used.

The pH adjusters may be used singly or in combination of two or more.

When the cleaning liquid contains the pH adjuster, the content thereof is selected depending on the types and amounts of other components and the pH of a target cleaning liquid, and is preferably 0.0001 to 0.03 mass % and more preferably 0.0005 to 0.01 mass % based on the total mass of the cleaning liquid.

Further, when the cleaning liquid contains the pH adjuster, the pH adjuster content is preferably 0.01 to 5 mass % and more preferably 0.02 to 2 mass % based on the total mass of components, excluding a solvent, in the cleaning liquid.

The cleaning liquid may contain other anticorrosives than the foregoing components.

Exemplary other anticorrosives include sugars such as fructose, glucose, and ribose, polyol compounds such as ethylene glycol, propylene glycol, and glycerin, polycarboxylic acid compounds such as polyacrylic acid, polymaleic acid, and copolymers thereof, polyvinylpyrrolidone, cyanuric acid, barbituric acid and its derivatives, glucuronic acid, squaric acid, α-keto acid, adenosine and its derivatives, a purine compound and its derivatives, phenanthroline, resorcinol, hydroquinone, nicotinamide and its derivatives, flavonol and its derivatives, anthocyanin and its derivatives, and combinations thereof.

For the polymer, the water-soluble polymers described in paragraphs [0043] to [0047] of JP 2016-171294 A can be applied, and the contents thereof are incorporated in the present specification.

For the fluorine compound, the compounds described in paragraphs [0013] to [0015] of JP 2005-150236 A can be applied, and the contents thereof are incorporated in the present specification.

For the organic solvent, any of known organic solvents may be used, and hydrophilic organic solvents such as alcohols and ketones are preferred. The organic solvents may be used singly or in combination of two or more.

The amounts of the polymer, fluorine compound and organic solvent for use are not particularly limited and may be suitably specified in the ranges that do not impair the effects of the invention.

The contents of the respective components above in the cleaning liquid can be measured by known methods such as gas chromatography-mass spectrometry (GC-MS), liquid chromatography-mass spectrometry (LC-MS), and ion-exchange chromatography (IC).

[Physical Properties of Cleaning Liquid]

<pH>

The cleaning liquid preferably shows alkaline properties. Specifically, the pH of the cleaning liquid is preferably more than 7.0 at 25° C.

The pH of the cleaning liquid is more preferably not less than 7.5, even more preferably not less than 8.0, and in terms of providing more excellent corrosion prevention performance with respect to a Cu-containing metal film, particularly preferably more than 9.0, and most preferably not less than 9.5 at 25° C. The upper limit of the pH of the cleaning liquid is not particularly limited and is preferably not more than 13.0, more preferably not more than 12.0, even more preferably not more than 11.5, and in terms of providing more excellent corrosion prevention performance with respect to a Co-containing metal film, particularly preferably less than 11.0, and most preferably not more than 10.5 at 25° C.

The pH of the cleaning liquid may be adjusted by using the foregoing pH adjusters as well as components functioning as the pH adjuster, such as the hydroxylamine compound, the amine oxide compound, the amine compound, the chelating agent, and the anionic surfactant.

The pH of the cleaning liquid can be measured with a known pH meter by the method according to JIS Z 8802-1984.

<Flash Point>

The cleaning liquid preferably has a flash point of not lower than 60° C. and more preferably has no flash point because this allows arbitrary changes of treatments or processes in handling of the cleaning liquid.

In this specification, the flash point refers to that measured according to JIS K 2265-2:2007, and the expression "has no flash point" means that ignition of a sample is not detected in the range of −30° C. to 300° C. when measurement is carried out with the above measurement method.

<Metal Content>

In the cleaning liquid, the content of each of metals (elemental metals Fe, Co, Na, K, Cu, Mg, Mn, Li, Al, Cr, Ni, Zn, Sn and Ag) contained as impurities in the liquid (calculated as the ion concentration) is preferably not more than 5 ppm by mass and more preferably not more than 1 ppm by mass. Since it is expected in manufacture of leading-edge semiconductor devices that a cleaning liquid with even higher purity should be required, the metal content is still more preferably less than 1 ppm by mass, that is, a value on the order of ppb by mass or less, and particularly preferably 100 ppb by mass or less. The lower limit thereof is not particularly limited and is preferably 0.

Exemplary methods of reducing the metal content include a refining treatment, such as distillation or filtration using ion-exchange resin or a filter, that is carried out in a stage of raw materials to be used in manufacture of the cleaning liquid or a stage after manufacture of the cleaning liquid.

Another method of reducing the metal content is the one using, as a container storing a raw material or the manufactured cleaning liquid, a container from which impurities are not largely leached, which will be described later. Still another method is providing lining of fluororesin on the portions of members that are to contact the relevant liquid, such as inner walls of pipes used in manufacture of the cleaning liquid, in order to prevent metal components from being leached from the members such as the pipes.

<Coarse Particles>

The cleaning liquid may contain coarse particles but preferably in a small amount. The coarse particles herein refer to particles with a diameter (particle size) of 0.4 µm or more when the particle shape is assumed to be a sphere.

For the coarse particle content of the cleaning liquid, the content of particles with a particle size of 0.4 µm or more is preferably not more than 1000 particles and more preferably not more than 500 particles per milliliter of the cleaning liquid. The lower limit thereof is not particularly limited and is for instance 0. The content of particles with a particle size of 0.4 µm or more measured by one of the foregoing measurement methods is even more preferably at or below the detection limit.

The coarse particles contained in the cleaning liquid are particles of dust, dirt, organic and inorganic solid matter, and the like contained as impurities in raw materials and particles of dust, dirt, organic and inorganic solid matter, and the like entering as contaminations during preparation of the cleaning liquid, which particles remain present as particles in the cleaning liquid at the end without being dissolved.

The content of the coarse particles present in the cleaning liquid can be measured in a liquid phase with a commercial measurement device for a light scattering liquid-borne particle counting method using a laser as a light source.

One exemplary method of removing the coarse particles is a refining treatment such as filtration to be described later.

The cleaning liquid may take the form of a kit including raw materials of the cleaning liquid that are separated into plural units.

One exemplary method of having the cleaning liquid in the form of a kit involves preparing a liquid composition containing the hydroxylamine compound and the amine oxide compound as a first liquid and preparing a liquid composition containing the other components as a second liquid.

[Manufacture of Cleaning Liquid]

The cleaning liquid can be manufactured by a known method. The method of manufacturing the cleaning liquid is described below in detail.

<Liquid Preparation Step>

The method of preparing the cleaning liquid is not particularly limited, and for instance, the cleaning liquid can be manufactured by mixing the foregoing components. The order and/or timing of incorporating the foregoing components are not particularly limited; for instance, the hydroxylamine compound and the amine oxide compound as well as optional components such as the chelating agent, the reducing agent, the amine compound, the surfactant, and/or the pH adjuster are sequentially added into a vessel containing purified pure water, and the resulting mixture is subjected to a mixing treatment such as stirring to thereby prepare the cleaning liquid. When added to the vessel, water and those components may be added at one time or may be divided into plural portions and separately added.

A stirrer and a stirring method used in preparation of the cleaning liquid are not particularly limited, and a known device may be used as the stirrer or a disperser. Examples of the stirrer include an industrial mixer, a portable stirrer, a mechanical stirrer, and a magnetic stirrer. Examples of the disperser include an industrial disperser, a homogenizer, an ultrasonic disperser, and a bead mill.

Mixing of the components in the preparation step of the cleaning liquid, a refining treatment to be described later, and storage of the manufactured cleaning liquid are carried out at a temperature of preferably not higher than 40° C. and more preferably not higher than 30° C. At the same time, not lower than 5° C. is preferred, and not lower than 10° C. is more preferred. The preparation, the treatment and/or the storage of the cleaning liquid within the above temperature range makes it possible to maintain stable performance for a long period of time.

(Refining Treatment)

One or more of raw materials used in preparation of the cleaning liquid is preferably subjected to a refining treatment in advance. The refining treatment is not particularly limited, and examples thereof include known methods such as distillation, ion exchange, and filtration.

The degree of refining is not particularly limited, and a raw material is refined to a purity of preferably not less than 99 mass % and more preferably not less than 99.9 mass %.

Examples of specific methods of the refining treatment include a method in which a raw material is passed through ion exchange resin or a reverse osmosis membrane (RO membrane), distillation of a raw material, and filtration to be described later.

As the refining treatment, the foregoing refining methods may be used in combination of two or more. For instance, a raw material may be firstly subjected to primary refinement in which the material is passed through a RO membrane and then to secondary refinement in which the material is passed through a refinement device made of cation exchange resin, anion exchange resin, or mixed-bed ion exchange resin. The refining treatment may be carried out plural times.

(Filtration)

A filter used in filtration is not particularly limited as long as it is of a type that has been conventionally used for filtration. Examples of the filter include filters made of fluororesins such as polytetrafluoroethylene (PTFE) and tetrafluoroethylene-perfluoroalkylvinylether copolymer (PFA), polyamide resins such as nylon, and polyolefin resins (including high density ones and ultra high molecular weight ones) such as polyethylene and polypropylene (PP). Preferred is a filter made of, of the above materials, a material selected from the group consisting of polyethylene, polypropylene (including high density polypropylene), fluororesin (including PTFE and PFA), and polyamide resin (including nylon), and more preferred is a filter made of fluororesin. By filtering a raw material with the filter made of such a material, foreign matter with high polarity that easily causes defects can be effectively removed.

The filter has a critical surface tension of preferably 70 to 95 mN/m and more preferably 75 to 85 mN/m. It should be noted that the value of the critical surface tension of the filter is a nominal value provided by its manufacturer. The use of the filter having a critical surface tension within the above range makes it possible to effectively remove foreign matter with high polarity that easily causes defects.

The filter has a pore size of preferably 2 to 20 nm and more preferably 2 to 15 nm. The pore size within the above range makes it possible to reliably remove fine foreign matter such as impurities and agglomerates contained in a raw material, while preventing clogging in filtration. The pore size herein can be determined by reference to a nominal value of the relevant filter manufacturer.

Filtration may be carried out only one time or two or more times. When filtration is carried out two or more times, the filters used may be the same or different.

Filtration is carried out preferably at room temperature (25° C.) or lower, more preferably at 23° C. or lower, and even more preferably at 20° C. or lower, and at the same time, preferably at 0° C. or higher, more preferably at 5° C. or higher, and even more preferably at 10° C. or higher. Filtration at a temperature within the foregoing range makes it possible to reduce the amounts of particulate foreign matter and impurities dissolved in a raw material and effectively remove foreign matter and impurities.

(Container)

The cleaning liquid (including an embodiment of a kit or a diluted solution to be described later) can be put into a given container and stored, transported and used as long as problems such as corrosion do not occur.

For the container, preferred is a container which has high cleanliness in its interior and in which leaching of impurities from the inner wall of a storage portion of the container to the liquid is suppressed, for semiconductor applications. Examples of such a container include various containers commercially available as containers for semiconductor cleaning liquids, as exemplified by, but not limited to, the "Clean Bottle" series manufactured by Aicello Corporation and "Pure Bottle" manufactured by Kodama Plastics Co., Ltd.

For the container storing the cleaning liquid, preferred is a container whose portion to contact the liquid, such as the inner wall of its storage portion, is formed from fluororesin (perfluororesin) or metal having undergone a rust proof and metal leaching prevention treatment.

The inner wall of the container is preferably formed from one or more resins selected from the group consisting of polyethylene resin, polypropylene resin, and polyethylene-polypropylene resin, or another resin different therefrom, or a metal having undergone a rust proof and metal leaching prevention treatment such as stainless steel, Hastelloy, Inconel, or Monel.

For another resin above, fluororesin (perfluororesin) is preferred. When such a container with its inner wall being formed from fluororesin is used, defects such as leaching of oligomers of ethylene or propylene can be suppressed as compared to a container with its inner wall being formed from polyethylene resin, polypropylene resin, or polyethylene-polypropylene resin.

Specific examples of such a container with its inner wall being formed from fluororesin include FluoroPure PFA composite drums manufactured by Entegris, Inc. In addition, the containers described in page 4 of JP 3-502677 A, page 3 of the description of WO 2004/016526, and pages 9 and 16 of the description of WO 99/046309 may also be used.

In addition to the foregoing fluororesin, quartz and an electrolytically polished metal material (i.e., a metal material having undergone electrolytic polishing) may also be preferably used for the inner wall of the container.

For a metal material used in manufacture of the foregoing electrolytically polished metal material, preferred is a metal material containing at least one selected from the group consisting of chromium and nickel, with the total content of chromium and nickel being more than 25 mass % based on the total mass of the metal material. Examples of such a metal material include stainless steel and a nickel-chromium alloy.

The total content of chromium and nickel in the metal material is more preferably not less than 30 mass % based on the total mass of the metal material.

The upper limit of the total content of chromium and nickel in the metal material is not particularly limited and is preferably not more than 90 mass %.

The method of electrolytic polishing of the metal material is not particularly limited, and any known methods may be used. For instance, the methods described in paragraphs [0011] to [0014] of JP 2015-227501 A and paragraphs [0036] to [0042] of JP 2008-264929 A may be used.

Preferably, the inside of the container is washed before being filled with the cleaning liquid. For a liquid used for washing, the amount of metal impurities in the liquid is preferably reduced in advance. After being manufactured, the cleaning liquid may be bottled in such containers as gallon bottles or quart bottles, transported and stored.

In order to prevent components in the cleaning liquid from changing during storage, the inside of each container may be replaced with an inert gas (nitrogen, argon or the like) having a purity of not less than 99.99995 vol % in advance. In particular, a gas with a low moisture content is preferred. While the transportation and the storage may be carried out at normal temperature, the temperature may be controlled to fall within the range of −20° C. to 20° C. to prevent the change of properties.

(Cleanroom)

It is preferable to conduct all of manufacture of the cleaning liquid, opening and washing of the containers, handling of the cleaning liquid such as filling, process and treatment analyses, and measurements in a cleanroom. The cleanroom preferably satisfies 14644-1 cleanroom standards. The cleanroom satisfies preferably one of ISO (International Organization for Standardization) Class 1, ISO Class 2, ISO Class 3, and ISO Class 4, more preferably ISO Class 1 or ISO Class 2, and even more preferably ISO Class 1.

<Dilution Step>

Preferably, the cleaning liquid as above is prepared in the form of a concentrated liquid with the content of a solvent such as water or an organic solvent being less than that when used in view of costs of raw materials, storage and transportation, and is used in cleaning of semiconductor substrates after a dilution step in which the concentrated liquid is diluted with a diluent such as water.

The dilution ratio of the cleaning liquid in the dilution step may be adjusted as appropriate depending on the types and contents of components and the type of semiconductor substrates to be cleaned, and the ratio of the diluted cleaning liquid to the cleaning liquid before dilution is preferably 5 to 5000 times, more preferably 10 to 1000 times, and even more preferably 20 to 500 times in mass ratio.

The cleaning liquid is diluted preferably with water because this leads to more excellent defect suppression performance.

When the cleaning liquid is in the form of a concentrated liquid, the contents of components are preferably within the following ranges.

The amine oxide compound content is preferably 0.001 to 15 mass %, more preferably 0.001 to 10 mass % and even more preferably 0.001 to 5 mass % based on the total mass of the concentrated cleaning liquid.

The hydroxylamine compound content is preferably not less than 0.1 mass %, more preferably not less than 0.5 mass % and even more preferably not less than 2.0 mass % based on the total mass of the concentrated cleaning liquid. The upper limit thereof is not particularly limited and is preferably not more than 20 mass % and more preferably not more than 15 mass %.

The water content of the concentrated cleaning liquid may be the balance other than the amine oxide compound, the hydroxylamine compound, and optional components described above. The water content is preferably not less than 1 mass %, more preferably not less than 30 mass %, even more preferably not less than 60 mass %, and particularly preferably not less than 85 mass % based on the total mass of the concentrated cleaning liquid. The upper limit thereof is not particularly limited and is preferably not more than 99 mass % and more preferably not more than 95 mass % based on the total mass of the concentrated cleaning liquid.

When the concentrated cleaning liquid contains the chelating agent, the chelating agent content is preferably not more than 25 mass %, more preferably not more than 10 mass %, even more preferably less than 2.0 mass %, and particularly preferably not more than 0.8 mass % based on the total mass of the concentrated cleaning liquid. The lower limit thereof is not particularly limited and is preferably not less than 0.001 mass %, more preferably not less than 0.01 mass % and even more preferably not less than 0.05 mass % based on the total mass of the concentrated cleaning liquid.

When the concentrated cleaning liquid contains the reducing agent, the reducing agent content is not particularly limited and is preferably 0.001 to 20 mass % and more preferably 0.01 to 15 mass % based on the total mass of the concentrated cleaning liquid.

When the concentrated cleaning liquid contains the hydrazide compound, the hydrazide compound content is not particularly limited and is preferably 0.1 to 20 mass %, more preferably 0.5 to 15 mass % and even more preferably 2 to 15 mass % based on the total mass of the concentrated cleaning liquid.

When the concentrated cleaning liquid contains the amine compound, the content thereof is preferably 0.01 to 15 mass % and more preferably 0.03 to 10 mass % based on the total mass of the concentrated cleaning liquid.

When the concentrated cleaning liquid contains the primary to tertiary amines, the content thereof is preferably 0.01 to 15 mass % and more preferably 0.03 to 10 mass % based on the total mass of the concentrated cleaning liquid.

When the concentrated cleaning liquid contains the quaternary ammonium compound, the content thereof is preferably 0.01 to 15 mass % and more preferably 0.03 to 10 mass % based on the total mass of the concentrated cleaning liquid.

When the concentrated cleaning liquid contains the surfactant, the content thereof is preferably 0.001 to 5.0 mass %, more preferably 0.005 to 3.0 mass % and even more preferably 0.01 to 1.0 mass % based on the total mass of the concentrated cleaning liquid.

When the concentrated cleaning liquid contains the pH adjuster, the content thereof is selected depending on the types and amounts of other components and the pH of a target cleaning liquid, and is preferably 0.01 to 3 mass % and more preferably 0.05 to 1 mass % based on the total mass of the concentrated cleaning liquid.

The pH of the concentrated cleaning liquid is preferably more than 7.0, more preferably not less than 8.0, even more preferably more than 10.0, and particularly preferably not less than 10.5 at 25° C. The upper limit of the pH of the concentrated cleaning liquid is not particularly limited and is preferably not more than 13.0, more preferably not more than 12.0, even more preferably less than 12.0, and particularly preferably not more than 11.5 at 25° C.

The change in pH from that before dilution to that after dilution (a difference between the pH of the cleaning liquid before dilution and the pH of the diluted cleaning liquid) is preferably not more than 1.0, more preferably not more than 0.8 and even more preferably not more than 0.5.

A specific method of diluting the cleaning liquid in the dilution step is not particularly limited, and the dilution step may be carried out according to the liquid preparation step of the cleaning liquid described above. A stirrer and a stirring method used in the dilution step are also not particularly limited, and stirring may be carried out with a known stirrer whose examples are listed in the liquid preparation step of the cleaning liquid described above.

Water used in the dilution step is preferably subjected to a refining treatment in advance. Preferably, the diluted cleaning liquid obtained in the dilution step is also subjected to a refining treatment.

The refining treatment is not particularly limited, and examples thereof include an ionic component reduction treatment using ion-exchange resin or a RO membrane, and removal of foreign matter through filtration, which are described above as examples of the refining treatment for the cleaning liquid; preferably, one of these treatments is carried out.

[Application of Cleaning Liquid]

The cleaning liquid is used in a cleaning step of cleaning a semiconductor substrate having undergone a chemical mechanical polishing (CMP) process. The cleaning liquid also can be used in cleaning of a semiconductor substrate in a semiconductor substrate manufacturing process and also used as a composition for buffing treatment, which will be described later.

Note that the diluted cleaning liquid obtained by diluting the cleaning liquid is used in actual cleaning of semiconductor substrates, as described above.

[Cleaning Object]

One example of a cleaning object to be cleaned with the cleaning liquid is a semiconductor substrate having metal-containing matter.

The expression "on a semiconductor substrate" in this specification includes places on the top, bottom and lateral sides of the semiconductor substrate and in a groove of the semiconductor substrate. The metal-containing matter on a semiconductor substrate includes not only metal-containing matter present directly on a surface of the semiconductor substrate but also metal-containing matter present on or above the semiconductor substrate via another layer.

A metal contained in the metal-containing matter is for instance at least one metal M selected from the group consisting of Cu (copper), Co (cobalt), W (tungsten), Ti (titanium), Ta (tantalum), Ru (ruthenium), Cr (chromium), Hf (hafnium), Os (osmium), Pt (platinum), Ni (nickel), Mn (manganese), Zr (zirconium), Mo (molybdenum), La (lanthanum), and Ir (iridium).

The metal-containing matter is not limited as long as it is a substance containing a metal (metallic atom), and examples thereof include a simple substance of the metal M, an alloy containing the metal M, an oxide of the metal M, a nitride of the metal M, and an oxynitride of the metal M.

The metal-containing matter may be a mixture containing two or more of those compounds.

The oxide, the nitride and the oxynitride above may be a composite oxide, a composite nitride and a composite oxynitride each of which contains a metal.

The metallic atom content of the metal-containing matter is preferably not less than 10 mass %, more preferably not less than 30 mass % and even more preferably not less than 50 mass % based on the total mass of the metal-containing matter. The upper limit thereof is 100 mass % because the metal-containing matter may be exactly the metal itself.

The semiconductor substrate has preferably the metal-containing matter (i.e., matter containing the metal M), more preferably the metal-containing matter containing at least one metal selected from the group consisting of Cu, Co, W, Ti, Ta, and Ru, and even more preferably the metal-containing matter containing at least one metal selected from the group consisting of Cu, Co, Ti, Ta, Ru, and W.

The semiconductor substrate that is a cleaning object to be cleaned with the cleaning liquid is not particularly limited, and examples thereof include one having a metal wiring film, a barrier metal, and an insulating film on a surface of a wafer constituting the semiconductor substrate.

Specific examples of the wafer constituting the semiconductor substrate include wafers made of silicon-based materials such as a silicon (Si) wafer, a silicon carbide (SiC) wafer, and a silicon-containing resin wafer (glass epoxy wafer), a gallium phosphide (GaP) wafer, a gallium arsenide (GaAs) wafer, and an indium phosphide (InP) wafer.

Applicable examples of the silicon wafer include an n-type silicon wafer in which a silicon wafer is doped with a pentavalent atom (e.g., phosphorus (P), arsenic (As), and antimony (Sb)), and a p-type silicon wafer in which a silicon wafer is doped with a trivalent atom (e.g., boron (B), and gallium (Ga)). A silicon of the silicon wafer may be any of, for example, amorphous silicon, monocrystalline silicon, polycrystalline silicon, and polysilicon.

In particular, the cleaning liquid is useful for wafers made of silicon-based materials such as the silicon wafer, the silicon carbide wafer, and the silicon-containing resin wafer (glass epoxy wafer).

The semiconductor substrate may have an insulating film on the wafer described above.

Specific examples of the insulating film include silicon oxide films (e.g., a silicon dioxide ($SiO_2$) film and a tetraethyl orthosilicate ($Si(OC_2H_5)_4$) film (TEOS film)), silicon nitride films (e.g., a silicon nitride ($Si_3N_4$) film and a silicon nitride/carbide (SiNC) film), and low dielectric (Low-k) films (e.g., a carbon-doped silicon oxide (SiOC) film and a silicon carbide (SiC) film).

Examples of a metal film that the semiconductor substrate has include a metal film containing at least one metal selected from copper (Cu), cobalt (Co), and tungsten (W), as exemplified by a film primarily composed of copper (copper-containing film), a film primarily composed of cobalt (cobalt-containing film), a film primarily composed of tungsten (tungsten-containing film), and a metal film constituted of an alloy including one or more selected from the group consisting of Cu, Co and W.

Examples of the copper-containing film include a wiring film composed only of metallic copper (copper wiring film) and a wiring film made of an alloy composed of metallic copper and other metals (copper alloy wiring film).

Specific examples of the copper alloy wiring film include a wiring film made of an alloy composed of copper and one or more metals selected from aluminum (Al), titanium (Ti), chromium (Cr), manganese (Mn), tantalum (Ta) and tungsten (W). More specifically, examples thereof include a copper-aluminum alloy wiring film (CuAl alloy wiring film), a copper-titanium alloy wiring film (CuTi alloy wiring film), a copper-chromium alloy wiring film (CuCr alloy wiring film), a copper-manganese alloy wiring film (CuMn alloy wiring film), a copper-tantalum alloy wiring film (CuTa alloy wiring film), and a copper-tungsten alloy wiring film (CuW alloy wiring film).

Examples of the cobalt-containing film (a metal film primarily composed of cobalt) include a metal film composed only of metallic cobalt (cobalt metal film) and a metal film made of an alloy composed of metallic cobalt and other metals (cobalt alloy metal film).

Specific examples of the cobalt alloy metal film include a metal film made of an alloy composed of cobalt and one or more metals selected from titanium (Ti), chromium (Cr), iron (Fe), nickel (Ni), molybdenum (Mo), palladium (Pd), tantalum (Ta) and tungsten (W). More specifically, examples thereof include a cobalt-titanium alloy metal film (CoTi alloy metal film), a cobalt-chromium alloy metal film (CoCr alloy metal film), a cobalt-iron alloy metal film (CoFe alloy metal film), a cobalt-nickel alloy metal film (CoNi alloy metal film), a cobalt-molybdenum alloy metal film (CoMo alloy metal film), a cobalt-palladium alloy metal film (CoPd alloy metal film), a cobalt-tantalum alloy metal film (CoTa alloy metal film), and a cobalt-tungsten alloy metal film (CoW alloy metal film).

The cleaning liquid is useful for a substrate having the cobalt-containing film. Of the cobalt-containing films, the cobalt metal film is often used as a wiring film, and the cobalt alloy metal film is often used as a barrier metal.

In some cases, it is preferable to use the cleaning liquid in cleaning of the semiconductor substrate having at least the copper-containing wiring film and the metal film (cobalt barrier metal), which is composed only of metallic cobalt and is a barrier metal of the copper-containing wiring film, on or above the wafer constituting the substrate, with the copper-containing wiring film and the cobalt barrier metal being in contact with each other at a surface of the substrate.

Examples of the tungsten-containing film (a metal film primarily composed of tungsten) include a metal film composed only of metallic tungsten (tungsten metal film) and a metal film made of an alloy composed of tungsten and other metals (tungsten alloy metal film).

Specific examples of the tungsten alloy metal film include a tungsten-titanium alloy metal film (WTi alloy metal film) and a tungsten-cobalt alloy metal film (WCo alloy metal film).

The tungsten-containing film is often used as a barrier metal.

The methods of forming the foregoing insulating film, copper-containing wiring film, cobalt-containing film and tungsten-containing film on the wafer constituting the semiconductor substrate are not particularly limited as long as they are known methods used in this field.

One exemplary method of forming the insulating film is a method in which the wafer constituting the semiconductor substrate is subjected to a heating treatment in the presence of oxygen gas to form a silicon oxide film, whereafter silane and ammonia gases are introduced to form a silicon nitride film by a chemical vapor deposition (CVD) method.

Exemplary methods of forming the copper-containing wiring film, the cobalt-containing film and the tungsten-containing film include a method in which a circuit is formed on the above wafer having the insulating film by a known method using a resist for instance, whereafter the copper-containing wiring film, the cobalt-containing film and the tungsten-containing film are formed by plating, the CVD method, and other methods.

<CMP Process>

The CMP process is, for instance, a process for planarizing a surface of the substrate having the metal wiring film, the barrier metal and the insulating film through a combination of a chemical action induced by use of a polishing slurry containing fine abrasive particles (abrasive grains) and mechanical polishing.

Abrasive grains (e.g., silica and alumina) used in the CMP process, metal impurities (metal residues) derived from the polished metal wiring film and barrier metal, and other impurities sometimes remain on the surface of the semiconductor substrate having undergone the CMP process. These impurities may cause short circuit between wirings and adversely affect electric characteristics of the semiconductor substrate; therefore, the semiconductor substrate having undergone the CMP process is subjected to a cleaning treatment to remove these impurities from the surface of the semiconductor substrate.

One specific example of the semiconductor substrate having undergone the CMP process is not limited to but includes a substrate having undergone the CMP process described in Journal of the Japan Society for Precision Engineering, Vol. 84, No. 3, 2018.

<Buffing Treatment>

A surface of the semiconductor substrate that is a cleaning object to be cleaned with the cleaning liquid may be subjected to a buffing treatment after the CMP process.

The buffing treatment is a treatment for reducing impurities on a surface of the semiconductor substrate by means of a polishing pad. Specifically, a surface of the semiconductor substrate having undergone the CMP process and the polishing pad are brought into contact with each other, and the semiconductor substrate and the polishing pad are moved to slide relatively to each other while a buffing composition is supplied to the contact portion therebetween. As a consequence, impurities on the surface of the semiconductor substrate are removed due to a frictional force caused by the polishing pad and a chemical action caused by the buffing composition.

For the buffing composition, a known buffing composition may be suitably used in accordance with the type of the semiconductor substrate and the types and amounts of impurities to be removed. Components contained in the buffing composition are not particularly limited, and examples thereof include a water-soluble polymer such as a polyvinyl alcohol, water serving as a dispersion medium, and an acid such as nitric acid.

One preferable embodiment of the buffing treatment is subjecting the semiconductor substrate to the buffing treatment using the above cleaning liquid as the buffing composition.

A polishing device and polishing conditions used in the buffing treatment are suitably selected from known devices and conditions in accordance with the type of the semiconductor substrate and substances to be removed. For the buffing treatment, for example, the treatment described in paragraphs [0085] to [0088] of WO 2017/169539 can be applied, and the contents thereof are incorporated in the present specification.

[Method of Cleaning Semiconductor Substrates]

The method of cleaning semiconductor substrates is not particularly limited as long as it includes a cleaning step of cleaning the semiconductor substrate having undergone the CMP process. It is preferable that the method of cleaning semiconductor substrates include a cleaning step in which the diluted cleaning liquid obtained in the foregoing dilution step is applied to the semiconductor substrate having undergone the CMP process to thereby clean the semiconductor substrate.

The cleaning step of cleaning the semiconductor substrate with the cleaning liquid is not particularly limited as long as it is a known method used for semiconductor substrates having undergone the CMP process, and any of methods carried out in this field may be suitably applied, as exemplified by brush scrubbing cleaning that, while supplying the cleaning liquid to the semiconductor substrate, brings a cleaning member such as a brush into physical contact with a surface of the semiconductor substrate to remove residues, an immersion method in which the semiconductor substrate is immersed in the cleaning liquid, a spinning (dropping) method in which the cleaning liquid is dropped while the semiconductor substrate is rotated, or a spraying method in which the cleaning liquid is sprayed. In cleaning by the immersion method, the cleaning liquid having the semiconductor substrate immersed therein is preferably subjected to an ultrasonic treatment because this can further reduce impurities remaining on the surface of the semiconductor substrate.

The cleaning step may be carried out only one time or two or more times. When the cleaning step is carried out two or more times, the same method may be repeated or different methods may be combined.

For the method of cleaning semiconductor substrates, any of a single wafer process and a batch process may be employed. The single wafer process is a method in which semiconductor substrates are treated one by one, while the batch process is a method in which a plurality of semiconductor substrates are treated at one time.

The temperature of the cleaning liquid used in cleaning of the semiconductor substrate is not particularly limited as long as it is the temperature employed in this field. While cleaning is typically carried out at room temperature (25° C.), the temperature can be arbitrarily selected in view of improvement in cleaning properties and/or suppression of damage to a member. The temperature of the cleaning liquid is preferably 10° C. to 60° C. and more preferably 15° C. to 50° C.

The cleaning time in cleaning of the semiconductor substrate depends on the types and contents of components contained in the cleaning liquid and therefore cannot be unconditionally stated; practically, the cleaning time is preferably 10 seconds to 2 minutes, more preferably 20 seconds to 1 minute and 30 seconds, and even more preferably 30 seconds to 1 minute.

The amount of supply (feed rate) of the cleaning liquid in the cleaning step of the semiconductor substrate is not particularly limited and is preferably 50 to 5000 mL/min and more preferably 500 to 2000 mL/min.

In cleaning of the semiconductor substrate, a mechanical stirring method may be used to further enhance the cleaning ability of the cleaning liquid.

Examples of the mechanical stirring method include a method involving circulating the cleaning liquid on the semiconductor substrate, a method involving flowing or spraying the cleaning liquid on the semiconductor substrate, and a method involving stirring the cleaning liquid by ultrasonics or megasonics.

The cleaning of the semiconductor substrate may be followed by a step of rinsing and washing the semiconductor substrate with a solvent (hereinafter called "rinsing step").

The rinsing step is preferably a step that consecutively follows the cleaning step of the semiconductor substrate and that is carried out with a rinsing solvent (rinsing liquid) for 5 seconds to 5 minutes. The rinsing step may be carried out using the mechanical stirring method as above.

Examples of the rinsing solvent include water (preferably deionized (DI) water), methanol, ethanol, isopropyl alcohol, N-methylpyrrolidinone, γ-butyrolactone, dimethyl sulfoxide, ethyl lactate, and propylene glycol monomethyl ether acetate. Alternatively, an aqueous rinsing liquid with a pH of more than 8 (e.g., a diluted aqueous ammonium hydroxide) may be used.

The forgoing method of bringing the cleaning liquid into contact with the semiconductor substrate is applicable as a method of bringing the rinsing solvent into contact with the semiconductor substrate in the same manner.

The rinsing step may be followed by a drying step for drying the semiconductor substrate.

The drying method is not particularly limited, and examples thereof include spin drying, a method involving flowing dry gas on the semiconductor substrate, a method involving heating the substrate by a heating means such as a hot plate or an infrared lamp, Marangoni drying, Rotagoni drying, isopropyl alcohol (IPA) drying, and any combinations thereof.

EXAMPLES

The present invention is described below in further detail based on examples. The materials, amounts of use, and ratios stated in examples below may be suitably modified as long as they do not depart from the scope and spirit of the present invention. Therefore, the scope of the present invention should not be construed as being limited to the examples below.

In the examples below, the pH values of cleaning liquids were measured at 25° C. with a pH meter (type: F-74, manufactured by HORIBA, Ltd.) according to JIS Z 8802-1984.

In manufacture of cleaning liquids of Examples and Comparative Examples, handling of containers and preparation, filling, storage, analysis and measurement of the cleaning liquids were all conducted in a cleanroom with the level satisfying ISO Class 2 or lower class. In measurement of the metal content of a cleaning liquid, when the content of a substance at or below the detection limit of ordinary measurement was measured, the measurement was carried out after the cleaning liquid was concentrated to 1/100 in terms of volume, and the measurement result was converted into a value of the metal content of the liquid at the concentration before the liquid was concentrated, in order to improve the measurement accuracy.

[Raw Materials of Cleaning Liquid]

The following compounds were used to manufacture the cleaning liquids.

[Hydroxylamine Compound (HA Compound)]

Diethylhydroxylamine (DEHA): manufactured by FUJIFILM Wako Pure Chemical Corporation N-Hydroxysuccinimide (NHSI): manufactured by FUJIFILM Wako Pure Chemical Corporation

[Amine Oxide Compound]

N-Ethylideneethylamine-N-oxide (DEHA-NO): manufactured using DEHA listed above according to the above-mentioned method of Yamaura et al.

Trimethylamine-N-oxide dihydrate (TM-NO): manufactured by FUJIFILM Wako Pure Chemical Corporation 4-Methylmorpholine-N-oxide (MMNO): manufactured by FUJIFILM Wako Pure Chemical Corporation

[Chelating Agent]

Tartaric acid: manufactured by FUJIFILM Wako Pure Chemical Corporation (corresponding to the hydroxy carboxylic acid-based chelating agent)

Bis(aminopropyl)ethylenediamine (BAPEDA): manufactured by FUJIFILM Wako Pure Chemical Corporation (corresponding to the polyamine-based chelating agent)

Diethylenetriaminepentaacetic acid (DTPA): manufactured by FUJIFILM Wako Pure Chemical Corporation (corresponding to the aminopolycarboxylic acid-based chelating agent)

1-Hydroxyethylidene-1,1-diphosphonic acid (HEDPO): "Dequest 2000" manufactured by Thermphos (corresponding to the phosphonic acid-based chelating agent)

[Amine Compound]

Piperazine: manufactured by FUJIFILM Wako Pure Chemical Corporation (corresponding to the amine having a cyclic structure)

Monoethanolamine (MEA): manufactured by FUJIFILM Wako Pure Chemical Corporation (corresponding to the amino alcohol)

2-Hydroxyethyl trimethylammonium hydroxide (choline): manufactured by FUJIFILM Wako Pure Chemical Corporation (corresponding to the quaternary ammonium compound)

2-Amino-2-methyl-1-propanol (AMP): manufactured by FUJIFILM Wako Pure Chemical Corporation (corresponding to the amino alcohol)

[Reducing Agent]

Pyrogallol: manufactured by FUJIFILM Wako Pure Chemical Corporation

Carbohydrazide (CHZ): manufactured by FUJIFILM Wako Pure Chemical Corporation

Ascorbic acid: manufactured by FUJIFILM Wako Pure Chemical Corporation

[Surfactant]

Alkyl phosphate ester ethylene oxide 3-mol adduct (denoted as "S-1" in Tables 1 and 2): "CRODAFOS O3A LQ" (commercial name) manufactured by Croda Japan KK (corresponding to the anionic surfactant)

Alkyl phosphate ester ethylene oxide 10-mol adduct (denoted as "S-2" in Tables 1 and 2): "CRODAFOS O10A LQ" (commercial name) manufactured by Croda Japan KK (corresponding to the anionic surfactant)

In addition, commercial ultrapure water (manufactured by FUJIFILM Wako Pure Chemical Corporation) was used in manufacture of the cleaning liquids in Examples and in the dilution step for the cleaning liquids.

[Manufacture of Cleaning Liquid]

Next, a method of manufacturing a cleaning liquid is described taking Example 1 as an example.

To ultrapure water, DEHA (hydroxylamine compound), DEHA-NO (amine oxide compound), tartaric acid (chelating agent), piperazine (amine compound), choline (quaternary ammonium compound), and pyrogallol (reducing agent) were added in respective amounts corresponding to the contents shown in Tables 1 and 2. However, the amount of choline added was adjusted such that the pH of a prepared cleaning liquid was to be 12.0. The resulting mixture was sufficiently stirred with a stirrer, thereby obtaining a concentrated cleaning liquid of Example 1.

Concentrated cleaning liquids of Examples 2 to 38 and Comparative Examples 1 to 5 with the compositions shown in Tables 1 and 2 were manufactured according to the manufacturing method of Example 1.

In each concentrated cleaning liquid manufactured, the remainder other than those components shown in Tables 1 and 2 was water. The water content of each concentrated cleaning liquid of Examples 1 to 38 was not less than 60 mass % based on the total mass of the cleaning liquid.

In Tables 1 and 2, the "Amount (%)" columns provide the contents (unit: mass %) of the respective components based on the total mass of the relevant concentrated cleaning liquid. The symbol "*1" in the amount column represents that the relevant component was added in an amount which allowed a prepared concentrated cleaning liquid to have the pH value shown in the "Concentrated cleaning liquid pH" column.

The values in the "Ratio 1" column each represent a mass ratio of the amine oxide compound content (the total content when plural amine oxide compounds were used; hereinafter the same applying to other components) to the hydroxylamine compound content (amine oxide compound content/ hydroxylamine compound content).

The values in the "Concentrated cleaning liquid pH" column represent pH values of the concentrated cleaning liquids of Examples and Comparative Examples at 25° C. measured with the above pH meter.

[Evaluation of Defect Suppression Performance]

Using a cleaning liquid for an evaluation test as prepared by diluting each concentrated cleaning liquid manufactured by the foregoing method, evaluation was made on defect suppression performance when a metal film having undergone chemical mechanical polishing was cleaned.

The concentrated cleaning liquid of each of Examples and Comparative Examples was taken in an amount of 1 mL and diluted with ultrapure water by the factor (volume ratio) stated in the "Dilution ratio" column in Tables 1 and 2 to prepare a cleaning liquid sample.

The water content of the prepared cleaning liquid of each Example was not less than 99.6 mass % based on the total mass of the cleaning liquid. The pH value of the cleaning liquid of each of Examples and Comparative Examples was within the range of 8.0 to 12.0.

A wafer (diameter: 8 inches) having on its surface a metal film made of copper, tungsten or cobalt was polished with FREX 200 (a polishing apparatus, manufactured by Ebara Corporation). As the polishing slurry, CSL5250C (commercial name, manufactured by FUJIFILM Planar Solutions LLC.) was used for a wafer having a Cu-containing film and a wafer having a Co-containing film, and W-2000 (commercial name, manufactured by Cabot Corporation) was used for a wafer having a W-containing film. The polishing pressure was 2.0 psi, and the feed rate of the polishing slurry was 0.28 mL/(min·cm$^2$). The polishing time was 60 seconds.

Thereafter, the polished wafer was subjected to scrubbing cleaning for 60 minutes by use of each cleaning liquid sample whose temperature was adjusted to room temperature (23° C.), followed by drying.

The number of defects with a length of at least 0.1 μm at the polished surface of the wafer obtained was detected with a defect detection apparatus (ComPlus II, manufactured by Applied Materials, Inc.), and the cleaning liquid was evaluated for the defect suppression performance according to the following evaluation criteria. The evaluation results are shown in Tables 1 and 2. As the number of defects detected at a polished surface of a wafer is smaller, the defect suppression performance can be evaluated to be more excellent.

"AA": The number of defects per wafer being not more than 50

"A": The number of defects per wafer being more than 50 and not more than 200

"B": The number of defects per wafer being more than 200 and not more than 500

"C": The number of defects per wafer being more than 500

[Evaluation of Corrosion Prevention Performance]

The concentrated cleaning liquid of each of Examples and Comparative Examples was taken in an amount of 2 mL and diluted with ultrapure water by the factor (volume ratio) stated in the "Dilution ratio" column in Tables 1 and 2 to prepare a cleaning liquid sample.

A wafer (diameter: 12 inches) having on its surface a metal film made of copper, tungsten or cobalt was cut to prepare a wafer coupon of 2 cm square. The thickness of each metal film was set to 200 nm. The wafer was immersed in the cleaning liquid sample (temperature: 25° C.) manufactured by the foregoing method and subjected to a 30-minute immersion treatment at a stirring rotational speed of 250 rpm. For each metal film, the film thicknesses before and after the immersion treatment were calculated, and the corrosion rate per unit time was calculated from the calculation results. Each cleaning liquid was evaluated for the corrosion prevention performance according to the following evaluation criteria. The results thereof are shown in Tables 1 and 2.

Note that a lower corrosion rate indicates better corrosion prevention performance of a cleaning liquid.

[Evaluation Criteria for Cu Film and W Film]
"AA": A corrosion rate of lower than 1.0 Å/min
"A": A corrosion rate of not lower than 1.0 Å/min and lower than 2.0 Å/min
"B": A corrosion rate of not lower than 2.0 Å/min and lower than 3.0 Å/min
"C": A corrosion rate of not lower than 3.0 Å/min

[Evaluation Criteria for Co Film]
"AA": A corrosion rate of lower than 0.5 Å/min
"A": A corrosion rate of not lower than 0.5 Å/min and lower than 1.0 Å/min
"B": A corrosion rate of not lower than 1.0 Å/min and lower than 2.0 Å/min
"C": A corrosion rate of not lower than 2.0 Å/min

TABLE 1

| | Concentrated cleaning liquid composition | | | | | | | | | | |
|---|---|---|---|---|---|---|---|---|---|---|---|
| | HA compound | | Amine oxide compound | | | Chelating agent | | Amine compound | | | |
| | Type | Amount (%) | Type | Amount (%) | Ratio 1 | Type | Amount (%) | Type | Amount (%) | Type | Amount |
| EX 1 | DEHA | 1.0 | DEHA-NO | 0.001 | 1.00E−03 | Tartaric acid | 1.9 | Piperazine | 0.1 | Choline | *1 |
| EX 2 | DEHA | 1.0 | DEHA-NO | 0.05 | 5.00E−02 | Tartaric acid | 1.9 | Piperazine | 0.1 | Choline | *1 |
| EX 3 | DEHA | 1.0 | DEHA-NO | 0.2 | 2.00E−01 | Tartaric acid | 1.9 | Piperazine | 0.1 | Choline | *1 |
| EX 4 | DEHA | 1.0 | DEHA-NO | 5.0 | 5.00E+00 | Tartaric acid | 1.9 | Piperazine | 0.1 | Choline | *1 |
| EX 5 | DEHA | 1.0 | DEHA-NO | 14.9 | 1.49E+01 | Tartaric acid | 1.9 | Piperazine | 0.1 | Choline | *1 |
| EX 6 | DEHA | 4.5 | DEHA-NO | 0.001 | 2.22E−04 | Tartaric acid | 1.9 | Piperazine | 0.1 | Choline | *1 |
| EX 7 | DEHA | 4.5 | DEHA-NO | 0.05 | 1.11E−02 | Tartaric acid | 1.9 | Piperazine | 0.1 | Choline | *1 |
| EX 8 | DEHA | 4.5 | DEHA-NO | 0.2 | 4.44E−02 | Tartaric acid | 1.9 | Piperazine | 0.1 | Choline | *1 |
| EX 9 | DEHA | 4.5 | DEHA-NO | 0.2 | 4.45E−02 | Tartaric acid | 1.9 | — | | Choline | *1 |
| EX 10 | DEHA | 4.5 | DEHA-NO | 0.2 | 4.45E−02 | Tartaric acid | 1.9 | Piperazine | 0.1 | Choline | *1 |
| EX 11 | DEHA | 4.5 | DEHA-NO | 5.0 | 1.11E+00 | Tartaric acid | 1.9 | Piperazine | 0.1 | Choline | *1 |
| EX 12 | DEHA | 4.5 | DEHA-NO | 14.9 | 3.31E+00 | Tartaric acid | 1.9 | Piperazine | 0.1 | Choline | *1 |
| EX 13 | DEHA | 4.5 | DEHA-NO | 0.2 | 4.45E−02 | Tartaric acid | 1.9 | Piperazine | 0.1 | Choline | *1 |
| EX 14 | DEHA | 4.5 | DEHA-NO | 0.2 | 4.45E−02 | Tartaric acid | 1.9 | Piperazine | 0.1 | Choline | *1 |
| EX 15 | DEHA | 4.5 | TM-NO | 0.001 | 2.22E−04 | Tartaric acid | 1.9 | Piperazine | 0.1 | Choline | *1 |
| EX 16 | DEHA | 4.5 | TM-NO | 0.2 | 4.44E−02 | Tartaric acid | 1.9 | Piperazine | 0.1 | Choline | *1 |
| EX 17 | DEHA | 4.5 | TM-NO | 5.0 | 1.11E+00 | Tartaric acid | 1.9 | Piperazine | 0.1 | Choline | *1 |
| EX 18 | DEHA | 4.5 | TM-NO | 14.9 | 3.31E+00 | Tartaric acid | 1.9 | Piperazine | 0.1 | Choline | *1 |
| EX 19 | DEHA | 4.5 | DEHA-NO | 0.2 | 4.44E−02 | Tartaric acid | 1.9 | Piperazine MEA | 0.1 0.1 | Choline | *1 |
| EX 20 | DEHA | 4.5 | DEHA-NO | 0.001 | 2.22E−04 | BAPEDA | 0.2 | Piperazine | 0.1 | AMP | *1 |

| | Concentrated cleaning liquid composition | | | | Concentrated cleaning liquid pH | Dilution ratio | Defect suppression performance | | | Corrosion prevention performance | | |
|---|---|---|---|---|---|---|---|---|---|---|---|---|
| | Reducing agent | | Surfactant | | | | | | | | | |
| | Type | Amount (%) | Type | Amount (%) | | | Cu | W | Co | Cu | W | Co |
| EX 1 | Pyrogallol | 0.025 | — | — | 12.0 | 100 | A | A | A | A | B | B |
| EX 2 | Pyrogallol | 0.025 | — | — | 12.0 | 100 | A | A | A | A | B | B |
| EX 3 | Pyrogallol | 0.025 | — | — | 12.0 | 100 | A | A | A | A | B | B |
| EX 4 | Pyrogallol | 0.025 | — | — | 12.0 | 100 | A | A | A | A | B | B |
| EX 5 | Pyrogallol | 0.025 | — | — | 12.0 | 100 | A | A | A | B | B | B |
| EX 6 | Pyrogallol | 0.025 | — | — | 12.0 | 100 | A | A | A | A | B | A |
| EX 7 | Pyrogallol | 0.025 | — | — | 12.0 | 100 | A | A | A | A | B | A |
| EX 8 | Pyrogallol | 0.025 | — | — | 12.0 | 100 | A | A | A | A | B | A |
| EX 9 | Pyrogallol | 0.025 | — | — | 12.0 | 100 | B | A | B | A | B | A |
| EX 10 | — | — | — | — | 12.0 | 100 | A | A | A | A | B | B |
| EX 11 | Pyrogallol | 0.025 | — | — | 12.0 | 100 | A | A | A | A | B | B |
| EX 12 | Pyrogallol | 0.025 | — | — | 12.0 | 100 | A | A | A | A | B | B |
| EX 13 | Pyrogallol | 0.025 | — | — | 11.0 | 100 | A | A | A | A | A | B |
| EX 14 | Pyrogallol | 0.025 | — | — | 10.0 | 100 | A | A | A | B | A | B |
| EX 15 | Pyrogallol | 0.025 | — | — | 12.0 | 100 | A | A | A | A | B | A |
| EX 16 | Pyrogallol | 0.025 | — | — | 12.0 | 100 | A | A | A | A | B | A |
| EX 17 | Pyrogallol | 0.025 | — | — | 12.0 | 100 | A | A | A | A | B | A |

TABLE 1-continued

| | | | | | | | | | | | | |
|---|---|---|---|---|---|---|---|---|---|---|---|---|
| EX 18 | Pyrogallol | 0.025 | — | — | 12.0 | 100 | A | A | A | B | B | A |
| EX 19 | Pyrogallol | 0.025 | — | — | 12.0 | 100 | A | A | AA | A | B | A |
| EX 20 | Pyrogallol | 0.025 | — | — | 11.0 | 100 | A | A | A | A | A | B |

EX: Example

TABLE 2

| | Concentrated cleaning liquid composition | | | | | | | | | | | |
|---|---|---|---|---|---|---|---|---|---|---|---|---|
| | HA compound | | Amine oxide compound | | | Chelating agent | | Amine compound | | | | |
| | Type | Amount (%) | Type | Amount (%) | Ratio 1 | Type | Amount (%) | Type | Amount (%) | Type | Amount | |
| EX 21 | DEHA | 4.5 | DEHA-NO | 0.05 | 1.11E−02 | BAPEDA | 0.2 | Piperazine | 0.1 | AMP | *1 | |
| EX 22 | DEHA | 4.5 | DEHA-NO | 0.2 | 4.44E−02 | BAPEDA | 0.2 | Piperazine | 0.1 | AMP | *1 | |
| EX 23 | DEHA | 4.5 | DEHA-NO | 5.0 | 1.11E+00 | BAPEDA | 0.2 | Piperazine | 0.1 | AMP | *1 | |
| EX 24 | DEHA | 4.5 | DEHA-NO | 14.9 | 3.31E+00 | BAPEDA | 0.2 | Piperazine | 0.1 | AMP | *1 | |
| EX 25 | DEHA | 4.5 | DEHA-NO | 0.001 | 2.22E−04 | DTPA | 0.1 | Piperazine | 0.1 | AMP | *1 | |
| EX 26 | DEHA | 4.5 | DEHA-NO | 0.2 | 4.44E−02 | DTPA | 2.0 | Piperazine | 0.1 | AMP | *1 | |
| EX 27 | DEHA | 4.5 | DEHA-NO | 0.2 | 4.44E−02 | DTPA | 1.0 | Piperazine | 0.1 | AMP | *1 | |
| EX 28 | DEHA | 4.5 | DEHA-NO | 0.2 | 4.44E−02 | DTPA | 0.1 | Piperazine | 0.1 | AMP | *1 | |
| EX 29 | DEHA | 4.5 | DEHA-NO | 14.9 | 3.31E+00 | DTPA | 0.1 | Piperazine | 0.1 | AMP | *1 | |
| EX 30 | DEHA | 4.5 | DEHA-NO | 0.2 | 4.44E−02 | HEDPO | 0.1 | Piperazine | 0.1 | AMP | *1 | |
| EX 31 | DEHA | 4.5 | DEHA-NO | 14.9 | 3.31E+00 | HEDPO | 0.1 | Piperazine | 0.1 | AMP | *1 | |
| EX 32 | DEHA | 4.5 | DEHA-NO TM-NO | 0.1 0.1 | 4.44E−02 | HEDPO | 0.1 | Piperazine | 0.1 | AMP | *1 | |
| EX 33 | DEHA | 2.25 | DEHA-NO | 0.2 | 8.89E−02 | HEDPO | 0.1 | Piperazine | 0.1 | AMP | *1 | |
| EX 34 | DEHA | 4.5 | DEHA-NO | 0.2 | 4.44E−02 | HEDPO | 0.1 | Piperazine | 0.1 | AMP | *1 | |
| EX 35 | DEHA | 4.5 | DEHA-NO | 0.2 | 4.44E−02 | HEDPO | 0.1 | Piperazine | 0.1 | AMP | *1 | |
| EX 36 | DEHA | 4.5 | DEHA-NO | 0.2 | 4.44E−02 | HEDPO | 0.1 | Piperazine | 0.1 | AMP | *1 | |
| EX 37 | DEHA NHSI | 2.25 2.25 | DEHA-NO | 0.2 | 8.89E−02 | HEDPO | 0.1 | Piperazine | 0.1 | AMP | *1 | |
| EX 38 | DEHA | 4.5 | MMNO | 0.2 | 4.44E−02 | HEDPO | 0.1 | Piperazine | 0.1 | AMP | *1 | |
| CE 1 | DEHA | 4.5 | DEHA-NO | 0.0001 | 2.22E−05 | Tartaric acid | 1.9 | Piperazine | 0.1 | Choline | *1 | |
| CE 2 | DEHA | 4.5 | DEHA-NO | 15.4 | 3.42E+00 | Tartaric acid | 1.9 | Piperazine | 0.1 | Choline | *1 | |
| CE 3 | — | | — | | — | Tartaric acid | 1.9 | Piperazine | 0.1 | Choline | *1 | |
| CE 4 | DEHA | 4.5 | — | | — | Tartaric acid | 1.9 | Piperazine | 0.1 | Choline | *1 | |
| CE 5 | — | | DEHA-NO | 0.2 | — | Tartaric acid | 1.9 | Piperazine | 0.1 | Choline | *1 | |

| | Concentrated cleaning liquid composition | | | | | | Defect suppression performance | | | Corrosion prevention performance | | |
|---|---|---|---|---|---|---|---|---|---|---|---|---|
| | Reducing agent | | Surfactant | | Concentrated cleaning liquid pH | Dilution ratio | | | | | | |
| | Type | Amount (%) | Type | Amount (%) | | | Cu | W | Co | Cu | W | Co |
| EX 21 | Pyrogallol | 0.025 | — | — | 11.0 | 100 | A | A | A | A | A | B |
| EX 22 | Pyrogallol | 0.025 | — | — | 11.0 | 100 | A | A | A | A | A | B |
| EX 23 | Pyrogallol | 0.025 | — | — | 11.0 | 100 | A | A | A | A | A | B |
| EX 24 | Pyrogallol | 0.025 | — | — | 11.0 | 100 | A | A | A | A | A | B |
| EX 25 | Pyrogallol | 0.025 | — | — | 11.0 | 100 | A | A | B | A | A | A |
| EX 26 | Pyrogallol | 0.025 | — | — | 11.0 | 100 | A | A | A | B | A | B |
| EX 27 | Pyrogallol | 0.025 | — | — | 11.0 | 100 | A | A | A | A | A | B |
| EX 28 | Pyrogallol | 0.025 | — | — | 11.0 | 100 | A | A | A | A | A | A |
| EX 29 | Pyrogallol | 0.025 | — | — | 11.0 | 100 | A | A | A | A | A | B |
| EX 30 | Pyrogallol | 0.025 | — | — | 11.0 | 100 | A | A | A | A | A | A |
| EX 31 | Pyrogallol | 0.025 | — | — | 11.0 | 100 | A | A | A | A | A | B |
| EX 32 | Pyrogallol | 0.025 | — | — | 11.0 | 100 | A | A | A | A | A | A |
| EX 33 | Pyrogallol CHZ | 0.025 2.25 | — | — | 11.0 | 100 | A | A | A | A | A | AA |
| EX 34 | Pyrogallol Ascorbic acid | 0.025 0.025 | — | — | 11.0 | 100 | A | A | A | A | A | AA |
| EX 35 | Pyrogallol | 0.025 | S-1 | 0.01 | 11.0 | 100 | A | A | AA | A | A | AA |
| EX 36 | Pyrogallol | 0.025 | S-1 S-2 | 0.01 0.01 | 11.0 | 100 | AA | A | AA | A | A | AA |
| EX 37 | Pyrogallol | 0.025 | — | — | 11.0 | 100 | A | A | A | A | A | A |
| EX 38 | Pyrogallol | 0.025 | — | — | 11.0 | 100 | B | A | B | A | A | A |
| CE 1 | Pyrogallol | 0.025 | — | — | 12.0 | 100 | C | C | C | A | B | B |
| CE 2 | Pyrogallol | 0.025 | — | — | 12.0 | 100 | A | A | A | C | C | C |
| CE 3 | Pyrogallol | 0.025 | — | — | 12.0 | 100 | C | C | C | C | C | C |

TABLE 2-continued

| | | | | | | | | | | | | |
|---|---|---|---|---|---|---|---|---|---|---|---|---|
| CE 4 | Pyrogallol | 0.025 | — | — | 12.0 | 100 | C | C | C | A | A | A |
| CE 5 | Pyrogallol | 0.025 | — | — | 12.0 | 100 | A | A | A | C | C | C |

EX: Example
CE: Comparative Example

As evident from Tables 1 and 2, it was confirmed that the cleaning liquid of the invention has excellent defect suppression performance and corrosion prevention performance.

It was confirmed that when the amine oxide compound content is not more than 0.01 mass % based on the total mass of the cleaning liquid, the corrosion prevention performance with respect to a Cu-containing metal film is more excellent (comparison between Example 4 and Example 5).

It was confirmed that when the mass ratio of the amine oxide compound content to the hydroxylamine compound content (amine oxide compound content/hydroxylamine compound content) is not more than 10.0, the corrosion prevention performance with respect to a Cu-containing metal film is more excellent (comparison between Example 4 and Example 5).

It was confirmed that when the hydroxylamine compound content is not less than 0.02 mass % based on the total mass of the cleaning liquid, the corrosion prevention performance with respect to a Co-containing metal film is more excellent (comparison between Examples 1 to 5 and Examples 6 to 8, 11 and 12).

It was confirmed that when the chelating agent is the aminopolycarboxylic acid-based chelating agent or the phosphonic acid-based chelating agent, the corrosion prevention performance with respect to a Co-containing metal film is more excellent (comparison between Examples 28 and 30 and Examples 13 and 22).

It was confirmed that when the chelating agent content is less than 0.02 mass % based on the total mass of the cleaning liquid, the corrosion prevention performance with respect to a Cu-containing metal film is more excellent (comparison between Example 13 and Example 26), and when the chelating agent content is not more than 0.008 mass % based on the total mass of the cleaning liquid, the corrosion prevention performance with respect to a Co-containing metal film is more excellent (comparison between Example 28 and Example 27).

It was confirmed that when the cleaning liquid contains the primary to tertiary amines, the defect suppression performance with respect to a Cu- or Co-containing metal film is more excellent (comparison between Example 8 and Example 9).

It was confirmed that when the cleaning liquid contains two or more primary to tertiary amines, the defect suppression performance with respect to a Co-containing metal film is even more excellent (comparison between Example 8 and Example 19).

It was confirmed that when the cleaning liquid contains the reducing agent, the corrosion prevention performance with respect to a Co-containing metal film is more excellent (comparison between Example 8 and Example 10), and when the cleaning liquid contains two or more reducing agents, the corrosion prevention performance with respect to a Co-containing metal film is even more excellent (comparison between Examples 33 and 34 and Example 8).

It was confirmed that when the cleaning liquid contains the surfactant, the defect suppression performance and corrosion prevention performance with respect to a Co-containing metal film are more excellent (comparison between Example 35 and Example 30), and when the cleaning liquid contains two or more surfactants, the defect suppression performance with respect to a Cu-containing metal film is more excellent (comparison between Example 36 and Example 35).

Meanwhile, cleaning liquids having the same composition as that of Example 28 in Table 2 except that a compound selected from the group of compounds below was used in place of DEHA-NO as the amine oxide compound were manufactured according to the manufacturing method of Example 1.

The group of compounds: N-ethylidenemethylamine-N-oxide, N-ethylidenepropylamine-N-oxide, N-ethylidenebutylamine-N-oxide, N-ethylideneethanolamine-N-oxide, N-ethylideneethoxyethanolamine-N-oxide, N-propylidenemethylamine-N-oxide, N-propylideneethylamine-N-oxide, N-propylidenepropylamine-N-oxide, N-propylidenebutylamine-N-oxide, N-propylideneethanolamine-N-oxide, N-butylidenemethylamine-N-oxide, N-butylideneethylamine-N-oxide, N-butylidenebutylamine-N-oxide, N-butylideneethanolamine-N-oxide, N-benzylidene-t-butylamine-N-oxide, 1-pyrroline-N-oxide, and 2,3,4,5-tetrahydropyrrolidine-N-oxide.

Using the cleaning liquids thus manufactured, the defect suppression performance and the corrosion prevention performance were evaluated in the same manner as above, and as a result, the evaluation results similar to those for Example 28 were obtained.

In the foregoing evaluation test for defect suppression performance and corrosion prevention performance, a wafer having on its surface a metal film made of copper, cobalt or tungsten was subjected to a CMP process, and then the polished surface of the wafer was subjected to a buffing treatment. In the buffing treatment, the cleaning liquid samples whose temperature was adjusted to room temperature (23° C.) were used as the buffing composition. The buffing treatment was carried out by means of the polishing apparatus used in the foregoing CMP process under the conditions of a polishing pressure of 2.0 psi, a feed rate of the buffing composition of 0.28 mL/min (min·cm2) and a buffing time of 60 seconds.

Thereafter, the wafer having undergone the buffing treatment was cleaned for 30 seconds using each of the cleaning liquid samples whose temperature was adjusted to room temperature (23° C.), followed by drying.

Using the polished surface of the wafer thus obtained, the corrosion prevention performance and defect suppression performance of each cleaning liquid were evaluated according to the foregoing evaluation test methods, and as a result the evaluation results similar to those of the cleaning liquids in the foregoing examples were confirmed.

What is claimed is:

1. A cleaning liquid for semiconductor substrates having undergone a chemical mechanical polishing process, the cleaning liquid comprising:
   an amine oxide compound that is a compound represented by Formula (2), or its salt; and at least one hydroxylamine compound selected from the group consisting of a hydroxylamine, a hydroxylamine derivative, and their salts, wherein a content of the amine oxide compound is 0.00001 to 0.15 mass % based on a total mass of the cleaning liquid:

(2)

where $R^3$, $R^4$ and $R^5$ each independently represent an alkyl group having 1 to 6 carbon atoms, and two of $R^3$, $R^4$ and $R^5$ may be bonded together to form a five- or six-membered nitrogen-containing non-aromatic ring that may have an alkyl group having 1 to 4 carbon atoms.

2. The cleaning liquid according to claim 1,
wherein a mass ratio of the content of the amine oxide compound to a content of the at least one hydroxylamine compound is not less than 0.001.

3. The cleaning liquid according to claim 1,
wherein the amine oxide compound comprises trimethylamine-N-oxide.

4. The cleaning liquid according to claim 1,
wherein the content of the amine oxide compound is 0.00001 to 0.05 mass % based on the total mass of the cleaning liquid.

5. The cleaning liquid according to claim 1,
wherein the hydroxylamine compound is a compound represented by Formula (3) or its salt:

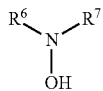

(3)

where $R^6$ and $R^7$ each independently represent a hydrogen atom or an organic group, and $R^6$ and $R^7$ may be bonded together to form a non-aromatic ring that may have a substituent.

6. The cleaning liquid according to claim 1,
wherein the hydroxylamine compound comprises diethylhydroxylamine.

7. The cleaning liquid according to claim 1,
wherein the cleaning liquid further comprises a chelating agent.

8. The cleaning liquid according to claim 7,
wherein the chelating agent comprises an aminopolycarboxylic acid-based chelating agent or a phosphonic acid-based chelating agent.

9. The cleaning liquid according to claim 1,
wherein the cleaning liquid further comprises a reducing agent.

10. The cleaning liquid according to claim 1,
wherein the cleaning liquid further comprises two or more reducing agents.

11. The cleaning liquid according to claim 1,
wherein the cleaning liquid further comprises a surfactant.

12. The cleaning liquid according to claim 1,
wherein the cleaning liquid further comprises two or more surfactants.

13. The cleaning liquid according to claim 1,
wherein the cleaning liquid further comprises at least one amine compound selected from the group consisting of a primary amine having a primary amino group in a molecule, a secondary amine having a secondary amino group in a molecule, a tertiary amine having a tertiary amino group in a molecule, a quaternary ammonium compound having a quaternary ammonium cation, and their salts.

14. The cleaning liquid according to claim 1,
wherein the cleaning liquid further comprises a quaternary ammonium compound having a quaternary ammonium cation, or its salt.

15. The cleaning liquid according to claim 14,
wherein the quaternary ammonium compound has an asymmetric structure.

16. The cleaning liquid according to claim 1,
wherein the cleaning liquid further comprises at least one selected from the group consisting of a primary amine having a primary amino group in a molecule, a secondary amine having a secondary amino group in a molecule, a tertiary amine having a tertiary amino group in a molecule, and their salts.

17. The cleaning liquid according to claim 1,
wherein the cleaning liquid further comprises water, and a content of the water is not less than 99.6 mass % based on the total mass of the cleaning liquid.

18. The cleaning liquid according to claim 1,
wherein the cleaning liquid has a pH of 8.0 to 12.0 at 25° C.

19. A method of cleaning semiconductor substrates, the method comprising a step of cleaning a semiconductor substrate having undergone a chemical mechanical polishing process by applying the cleaning liquid according to claim 1 to the semiconductor substrate.

20. The method according to claim 19,
wherein the semiconductor substrate has a metal film containing at least one metal selected from the group consisting of copper, cobalt, and tungsten.

* * * * *